United States Patent
Sartee et al.

(10) Patent No.: US 9,547,050 B2
(45) Date of Patent: Jan. 17, 2017

(54) METHOD AND APPARATUS FOR DETECTING DIRECTION OF A MAGNETIC FIELD

(71) Applicant: Apple Inc., Cupertino, CA (US)

(72) Inventors: Jared A. Sartee, Saratoga, CA (US); Benjamin M. Rappoport, San Francisco, CA (US); Samuel Gilkison Smith, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 122 days.

(21) Appl. No.: 14/035,699

(22) Filed: Sep. 24, 2013

(65) Prior Publication Data

US 2014/0097835 A1 Apr. 10, 2014

Related U.S. Application Data

(60) Provisional application No. 61/709,928, filed on Oct. 4, 2012.

(51) Int. Cl.
*G01R 33/02* (2006.01)
*G01R 33/07* (2006.01)

(52) U.S. Cl.
CPC .................................... *G01R 33/07* (2013.01)

(58) Field of Classification Search
CPC ......... G01R 33/02; G01R 33/00; G01R 33/07; G01R 33/09; G01R 15/148; G01R 15/207; G01R 19/00; G01R 15/14; G01R 15/20
See application file for complete search history.

(56) References Cited

U.S. PATENT DOCUMENTS

| | | | |
|---|---|---|---|
| 6,169,396 B1* | 1/2001 | Yokotani et al. | 324/207.21 |
| 6,323,642 B1* | 11/2001 | Nishimura et al. | 324/207.2 |
| 7,342,399 B1* | 3/2008 | Wiegert | 324/326 |
| 2004/0012559 A1* | 1/2004 | Seki et al. | 345/156 |
| 2009/0066321 A1* | 3/2009 | Edelstein | G01V 3/15 324/207.24 |
| 2009/0315547 A1* | 12/2009 | Abwa | G01R 33/02 324/244 |
| 2011/0221432 A1* | 9/2011 | Oota | 324/251 |
| 2012/0209054 A1* | 8/2012 | Riehl et al. | 600/13 |

* cited by examiner

*Primary Examiner* — Son Le
(74) *Attorney, Agent, or Firm* — Downey Brand LLP

(57) ABSTRACT

An integrated system of sensors that can be used to detect a direction of an externally applied magnetic field is disclosed. In one embodiment, the system can be incorporated into a compact package that can be used within an electronic device. A processor can use signals provided by the sensor system to provide an indication of the direction of the externally applied magnetic field. In one embodiment, the sensors can take the form of analog sensors such as Hall Effect sensors configured in such a way that the direction of the externally applied magnetic field can be deduced based in part upon detection signals provided by the Hall Effect sensors. In one embodiment, the Hall Effect sensors can be stacked one atop the other in such a way that relative signal strength of the detection signals from the sensors can indicate the direction of the externally applied magnetic field.

20 Claims, 17 Drawing Sheets

METHOD AND APPARATUS FOR DETECTING DIRECTION OF A MAGNETIC FIELD

CROSS-REFERENCE TO RELATED APPLICATIONS

This application claims the benefit of U.S. Provisional Patent Application No. 61/709,928, filed Oct. 4, 2012, and entitled "METHOD AND APPARATUS FOR DETECTING DIRECTION OF A MAGNETIC FIELD IN A SINGLE CHIP CONFIGURATION", which is incorporated herein by reference in its entirety for all purposes.

TECHNICAL FIELD

The present disclosure relates generally to sensors and sensor systems. More specifically, configuring multiple sensors in a single package directed at detecting a direction of a magnetic field.

BACKGROUND

A Hall Effect sensor is a transducer that varies its output voltage in response to a magnetic field. Generally, Hall Effect sensors are used for proximity switching, positioning, speed detection, and current sensing applications. In its simplest form, the Hall Effect sensor operates as an analog transducer directly returning a voltage that can be used with a known magnetic field from a magnet to determine a distance between the Hall Effect sensor and the magnet. Unfortunately, the voltage generated by the Hall Effect sensor cannot be used to distinguish a direction of a magnetic vector associated with the magnetic field. For example, since the direction of the magnetic vector cannot be resolved, even though the Hall Effect sensor can be used to deduce a distance between the magnet and the Hall Effect sensor, the direction of the magnetic field cannot be deduced and therefore the actual location of the magnet relative to the Hall Effect sensor (i.e., up, down, right, left) cannot be determined.

Therefore, what is desired is a method, apparatus, and system for determining a direction of a magnetic field.

SUMMARY

A sensor system configured to detect a direction of a magnetic field incident thereon is described.

In the first embodiment, a sensor system configured to detect a direction of an externally applied magnetic field magnetic field includes a first magnetic sensor and second magnetic sensor. The second magnetic sensor is stacked atop the first magnetic sensor a distance from the first magnetic sensor. The magnetic field includes at least a first magnetic field value and a second magnetic field value. The first magnetic sensor is configured to interact with the magnetic field and generate a first detection signal in accordance with the first magnetic field value. Similarly, the second magnetic sensor field is configured to interact with the magnetic field and generate a second detection signal in accordance with the second magnetic field value. The sensor system can also include a comparator in electrical communication with the first and second magnetic sensors for determining a direction of the magnetic field with respect to the first and second magnetic sensors by comparing the first and second detection signals.

In one aspect of the embodiment, the comparator determines the direction of the external magnetic field based upon a difference value of the first and second detection signals in accordance to a separation distance between the first and second magnetic sensors. When the difference value indicates that the value of the first detection signal is greater than the value of the second detection signal then the comparator determines that the direction of magnetic field is a first direction, the first direction being that in which the first magnetic sensor is closer to the source of the external magnetic field than the second magnetic sensor. When the difference value indicates that the value of the first detection signal is less than the value of the second detection signal then the processor determines that the direction of magnetic field is a second direction, the second direction being that in which the second magnetic sensor is closer to the source of the external magnetic field than the first magnetic sensor. The directional determining is based upon the fact that magnetic field strength varies inversely with distance. Since a detection signal (that can take the form of a voltage signal) can depend upon a magnetic field strength, the detection signal can, therefore, also vary inversely with the distance between the magnetic sensor and the source of the magnetic field.

In another embodiment, a sensor system includes a first magnetic sensor disposed a first distance from a first side of a reference plane and a second magnetic sensor disposed a second distance from a second side of a reference plane. The first side and second side of the reference plane are opposite. The first and second magnetic sensors are configured to provide a first magnetic detection signal and a second magnetic detection signal respectively. The sensor system also includes a comparator in communication with the first and second magnetic sensors for comparing the detection signal values provided by the first and second magnetic sensors to determine a location of the magnetic source with respect to the reference plane.

In yet another embodiment, a method of determining a direction of an externally applied magnetic field by a sensor system comprising a first and second magnetic sensor, the second magnetic sensor being stacked atop the first magnetic sensor a distance from the first magnetic sensor is disclosed. The method is carried out by generating a first detection signal with a first magnetic sensor and generating a second detection signal with a second magnetic sensor. The first and second detection signals are based on a first magnetic field value and a second magnetic field value respectively. The method further includes determining a direction of the magnetic source with respect to the first and second magnetic sensors by comparing the first and second detection signal values.

Other apparatuses, methods, features and advantages of the disclosure will be or will become apparent to one with skill in the art upon examination of the following figures and detailed description. It is intended that all such additional systems, methods, features and advantages be included within this description, be within the scope of the disclosure, and be protected by the accompanying claims.

BRIEF DESCRIPTION OF THE DRAWINGS

The included drawings are for illustrative purposes and serve only to provide examples of possible structures and arrangements for the disclosed, packaging systems, packaged product assemblies, and methods for packaging. These drawings in no way limit any changes in form and detail that can be made to the disclosure by one skilled in the art without departing from the spirit and scope of the disclosure.

DETAILED DESCRIPTION

Figure 1A:
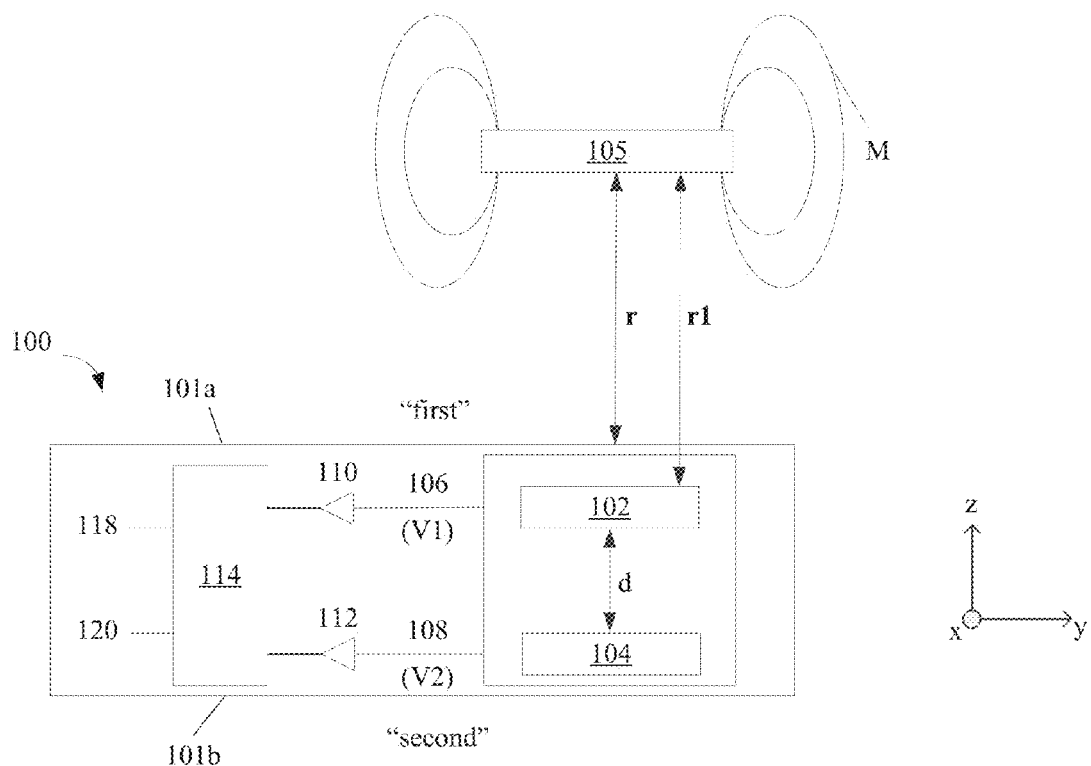
FIG. 1A shows a cross-sectional side view of a sensor system configured to detect a direction of a magnetic field in accordance with the described embodiments.

Exemplary applications of apparatuses, assemblies, systems, and methods according to the present disclosure are described in this section. These examples are being provided solely to add context and aid in the understanding of the disclosure. It will thus be apparent to one skilled in the art that the present disclosure can be practiced without some or all of these specific details. In other instances, well known process steps have not been described in detail in order to avoid unnecessarily obscuring the present disclosure. Other applications are possible, such that the following examples should not be taken as limiting.

The embodiments described herein relate to mechanism, method, and system for detecting a direction of a magnetic field. It should be noted that in the context of this discussion, the direction of the magnetic field can be defined as a direction of increasing magnetic field strength that can be determined by evaluating a change in magnetic flux density (magnetic field lines per unit area). Since magnetic flux lines diverge approximately as an inverse square function of distance from a magnetic source, magnetic flux density will change as a function of the distance from the magnetic source. In other words, as the distance to the magnetic source decreases, the magnetic flux density increases. In this way, a direction from a location to the magnetic source can be derived by determining a change (gradient) of the magnetic flux density at that location. Accordingly, an increasing magnetic flux density (referred to herein as a positive magnetic flux density) indicates an increasing magnetic field strength indicating that movement along that positive gradient leads to the source of the magnetic field (and vice versa). Therefore, the nature of the magnetic field at a location can be used to determine a relative direction of a source of the magnetic field with respect to the location.

In one embodiment, magnetic sensors can be used to characterize a magnetic field. The characterization of the magnetic field at a location can be used to determine a direction of a source of the magnetic field relative to the location. The direction of the magnetic field can be determined by evaluating a magnetic field strength concurrently at at least two separate locations. A comparison of the magnetic field strengths can then be used to determine a direction of increasing magnetic field strength (positive magnetic flux gradient) that, in turn, provides an indication of a direction of the magnetic field with respect to the at least two separate locations. For example, if a first magnetic field strength at a first location is a first magnetic field strength value and second magnetic field strength is currently associated with a second, different location, the difference between the first and second field strength values can provide a direction of the source of the magnetic field. In some embodiments, detecting a direction of the source of the magnetic field can be limited to detecting a direction with respect to opposing sides of an electronic device within which the sensor system is disposed. In other embodiments, a number of magnetic sensors can be used to detect a location of a magnetic source of the magnetic field in three dimensional space with respect to a location of the sensor system.

In one embodiment, the sensor system can be incorporated into a compact package that can be used within an electronic device. The electronic device can, in turn, include a processor in communication with the sensor system. The processor can be configured to direct various actions based upon signals provided by the sensor system that provide an indication of a direction of the externally applied magnetic field. For example, a device associated with the sensor system can be configured to operate in accordance with a first operational state when a magnetic field is sensed from a first direction while operating in accordance with a second operational state when a magnetic field is sensed from a second direction.

In one embodiment, the sensors can take the form of analog sensors such as Hall Effect sensors. A single Hall Effect sensor is generally configured to measure a magnetic field strength associated with an externally applied magnetic field. By using a number of Hall Effect sensors to detect magnetic field strengths at different locations and comparing the outputs provided by the Hall Effect sensors, a direction of the externally applied magnetic field can be deduced based at least in part upon detection signals provided by the Hall Effect sensors.

In one embodiment, a sensor system can include a first magnetic sensor configured to determine a first magnetic field strength of a magnetic field at a first location. The system can include a second magnetic sensor displaced from the first magnetic sensor at a second location configured to determine a second magnetic field strength at the second location. The first and second magnetic sensors can communicate with a processor that uses information provided by the first and second magnetic sensors to determine a direction of the magnetic field with respect to the sensor system. The first and second magnetic sensors can each include an active area that interacts with the magnetic field. An active area is a magnetically sensitive portion of the sensor system that is configured to generate a signal in accordance with a flux density of a portion of the magnetic field incident to the active area. For example, an active area can be a Hall plate, metal reed, or magnetoresistive element. Accordingly, the relative locations of the active areas can influence the performance of the sensor system. For example, in one configuration, the first and second magnetic sensors can be stacked atop each other in such a way that relative signal strength of the detection signals from the two magnetic sensors can indicate whether the externally applied magnetic field is being emitted from a particular location relative to the sensor system. For example, when the signal strength of a first detection signal from the first magnetic sensor is greater than a second detection signal from the second magnetic sensor located a distance "d" from the first magnetic sensor, then the direction of the externally applied magnetic field can be deduced to be in a location closer to the first magnetic sensor (relative to the second magnetic sensor). This deduction can be based in part upon the fact that a voltage output of each of the magnetic sensors is directly related to a magnetic field strength at the magnetic sensor respectively. Because the magnetic field strength varies inversely with distance from a magnetic source, lower voltage output is indicative of the magnetic field being farther away from a given magnetic sensor. Therefore, a detectable difference in output voltage between the two sensors indicates that the magnetic field strength is greater at one sensor than the other and therefore is closer to the source of the magnetic field. In one embodiment, a comparator associated with the sensor system can use the signals from the magnetic sensors of the sensor system to determine the direction of the magnetic source with respect to opposing sides of the sensor system and then provide the determination to a processor associated with the electronic device.

In one embodiment, the output voltage difference between the magnetic sensors of the sensor system can be increased by disposing one or more elements within the sensor system that modify the magnetic field proximate the magnetic sensors. In this way, the sensors can more easily distinguish a direction of the magnetic field. For example, the elements can include magnetic concentrators and/or magnetic absorbers. By arranging these elements in close proximity to the magnetic sensors, a magnetic field strength detected at a first magnetic sensor can be substantially greater than or alternatively substantially less than a magnetic field strength detected at a second magnetic sensor. Accordingly the output voltage difference between the magnetic sensors of the sensor system increases.

In another embodiment, the output voltage difference between the first and second magnetic of a sensor system can be increased by disposing the first and second magnetic sensors at a variety of offsets. For example, the first and second magnetic sensors can be offset both laterally and vertically relative to one another. The offsets can bring one magnetic sensor closer to a portion of a magnetic source while bringing the other magnetic sensor farther from the portion of the magnetic source, thereby increasing the output voltage difference between the magnetic sensors of the sensor system.

The sensor system can be disposed in compact packaging that is well suited for use in portable applications. For example, the sensor system can be used to determine if a cover or other device emitting a magnetic field is on the top or the bottom of a tablet computer. It can also be used in mobile phone applications. For example, the sensor system can be used to initiate a near field communication session. The mobile phone application can use information provided by the sensor system to determine a relative location and proximity of another electronic device. In one implementation, whichever device is positioned on top will transfer while the other device on the bottom will receive. In some cases both a specific orientation and a minimum distance can be required to initiate the near field communication session.

These and other embodiments are discussed below with reference to FIGS. 1A-8D; however, those skilled in the art will readily appreciate that the detailed description given herein with respect to these figures is for explanatory purposes only and should not be construed as limiting.

FIG. 1A shows a cross-sectional side view of sensor system 100 configured to detect a direction of magnetic field M in accordance with the described embodiments. Magnetic source 105 can be any material or object that emits magnetic field M. For example, magnetic source 105 can be a permanent magnet that creates its own persistent magnetic field or a current-induced magnet such as an electromagnet.

Sensor system 100 can include first sensing surface 101a and second sensing surface 101b. First and second sensing surfaces 101a and 101b can be a portion of the sensor system's housing or enclosure. For example, sensor system 100 can be packaged in single substrate, integrated chip configuration such that first and second sensing surfaces 101a and 101b define two sides of the chip's housing and also define the longitude length of the housing. Furthermore, first and second sensing surfaces 101a and 101b can be opposite with respect to each other so first sensing surface 101a can define a "first" side of sensor system 100 while second sensing surface 101b can define a "second" side of sensor system 100. First and second sensing surfaces 101a and 101b can also be substantially parallel to each other.

Sensor system 100 can also include a first magnetic sensor 102 and a second magnetic sensor 104, each configured to detect magnetic field M from magnetic source 105. Magnetic sensors 102 or 104 can be any of a number of different magnetic sensor types including, for example, reed switches, Hall Effect sensors, magnetoresistance sensors, magnetodiodes, and compasses. Furthermore, magnetic sensors 102 or 104 can include one or more magnetic sensors. In some embodiments, first magnetic sensor 102 can be identical to second magnetic sensor 104 (e.g., each sensor has substantially the same magnetic sensitivity), while in other embodiments the magnetic sensors can utilize different sensors or magnetic materials (e.g., each sensor can have a different magnetic sensitivity). In one aspect of the embodiment, first magnetic sensor 102 and second magnetic sensor 104 are disposed and positioned within sensor system 100 such that the active areas of the magnetic sensors sufficiently interact with magnetic field M when magnetic source 105 is located at the "first" side and/or the "second" side of sensor system 100. For example, first and second magnetic sensors 102 and 104 can include a Hall Effect sensor having a Hall plate (i.e. active area) made from a conductive material that is sensitive to magnetic field components perpendicular to the Hall plate. First and second magnetic sensors 102 and 104 can be disposed and positioned within sensing system 100 such that their Hall plates are parallel with first and second sensing surfaces 101a and 101b. Therefore, a magnetic source located at the "first" side and/or the "second" side emitting a magnetic field with components incident and perpendicular to first or second sensing surfaces 101a and 101b can sufficiently interact with sensor system 100 since those magnetic field components will also substantially interact with each Hall plate. Accordingly, first and second sensing surfaces 101a and 101b can indicate to a user the appropriate orientation of magnetic source 105 relative to the sensing system 100 as well as indicate which sides of sensing system 100 are configured to sufficiently interact with magnetic source 105 (e.g. "first" and "second" sides as defined by first and second sensing surfaces 101a and 101b).

In one embodiment, sensor system 100 can be configured to determine a location of magnetic source 105 relative to sensor system 100. In this particular embodiment, the locational determination can be limited to determining which side of sensor system 100 magnetic source 105 is located on. Sensor system 100 can be configured to detect when magnetic source 105 is in a location at the "first" side or in a location at the "second" side of sensor system 100. In one aspect of the embodiment, first magnetic sensor 102 and second magnetic sensor 104 can be disposed such that one of the magnetic sensors will be closer to magnetic source 105 relative to the other magnetic sensor when the magnetic source 105 is at the "first" or "second" side of sensor system 100. For example, as depicted, first magnetic sensor 102 and second magnetic sensor 104 can be stacked or layered a distance "d" apart. In one aspect of the embodiment, the magnetic sensors 102 and 104 are stacked in between first sensing surface 101a and second sensing surface 101b so that one magnetic sensor is closer to a particular surface relative to the other magnetic sensor. For example, first magnetic sensor 102 can be stacked atop second magnetic sensor 104 such that first magnetic sensor 102 is closer to first sensing surface 101a relative to second magnetic sensor 104 as depicted in FIG. 1A. Consequently, first magnetic sensor 102 is a distance r1 from magnetic source 105 while second magnetic sensor 104 is a distance r1+d from magnetic sensor 104 when magnetic source 105 is at the "first" side. As distance "r1" becomes increasingly greater than distance "d", an offset between detected field strengths at first magnetic sensor 102 and second magnetic sensor 104 become increasingly harder to detect. For at least this reason, sensor system 100 can be configured to output a signal only once a threshold magnetic field strength is detected.

Both first magnetic sensor 102 and second magnetic sensor 104 respond to magnetic field M by providing first detection signal 106 and second detection signal 108, respectively. Sensor system 100 can also include a processor 114 configured to receive first detection signal 106 and second detection signal 108 from amplifiers 110 and 112 respectively. Amplifiers 110 and 112 can amplify first and second detection signals 106, 108 to magnitudes suitable for processing by processor 114. Processor 114 can include circuitry configured to compare detection signals 106, 108. For example, in the case where first detection signal 106 and second detection signal 108 can take the form of output voltages V1 and V2, processor 114 can include a comparator configured to compare output voltages V1 and V2 to determine a direction of magnetic field M.

After comparing output voltages V1 and V2, processor 114 can output first output signal 118 indicating which output voltage (V1 or V2) is greater, which in turn can indicate a direction of magnetic source 105 relative to the sensor system 100. Processor 114 can also output second output signal 120 to provide addition information such as the polarity of the magnetic source 105, output voltage V1 or V2, or a difference between output voltages V1 and V2. Hence, sensor system 100 can provide a direction of magnetic source 105 with respect to sensor system 100 in addition to other characteristics of magnetic field M. This feature of the embodiment is particularly advantageous over prior magnetic sensors as it provides a direction of magnetic source 105 with respect to sensor system 100 and other characteristics in accordance with magnetic field M using only two magnetic sensors.

In one aspect of the embodiment, sensor system 100 only triggers an output when a certain condition is met. For example, sensor system 100 can be configured to only trigger when the magnetic source is located at the "first" side of sensor system 100. In another example, sensor system 100 can be configured to trigger only when the magnetic source is not at a location relative to sensor system 100 (e.g. not at the "first" side). Another processor (not shown) in communication with sensor system 100 can perform an action responsive to first output signal 118 and/or second output signal 120.

Furthermore, processor 114 can be configured to adjust first detection signal 106 and/or second detection signal 108 when first magnetic sensor 102 and second magnetic sensor 104 have different magnetic sensitivity. For example, second magnetic sensor 104 can be more magnetically sensitive than first magnetic sensor 102. In one scenario, output voltage V1 and V2 are substantially equal when the magnetic source is at a distance "r" from sensor system 100, despite second magnetic sensor 104 being farther from magnetic source 105 as shown in FIG. 1A. Consequently, the difference between output voltages V1 and V2 is too small and therefore undetectable. This is due to second magnetic sensor 104 being more magnetically sensitive than first magnetic sensor 102. Magnetic sensitivity of the sensors can be substantially different for any number of reasons. In one case, a magnetic sensor can be more magnetically sensitive than a seemingly identical magnetic sensor due to manufacturing variations. In another case, a magnetic sensor's magnetic sensitivity can degrade over time and usage, making it less magnetically sensitive to other magnetic sensors in the sensor system. In yet another case, it can be desirable that one magnetic sensor is more magnetically sensitive; for example a first magnetic sensor can be more sensitive relative to a second magnetic sensor so that the magnetic source could be detected farther from the first surface than the second surface, where early detection is preferred on the first side over the second side. Processor 114 can be configured to calibrate the sensor system such that the output difference from the magnetic sensors is detectable. An initial factory calibration can help overall quality control of the sensors. By running an initial factory calibration both intentional and unintentional variations in sensitivity can be accounted for. Furthermore, calibrations can be conducted periodically to maintain a threshold accuracy of sensor system 100. With this calibration data, processor 114 can attenuate the output (in accordance with the difference of magnetic sensitivity between the magnetic sensors) of the more magnetically sensitive sensor such that the outputs from the magnetic sensors are not equal when the magnetic source is at a particular distance from the sensor system.

Figure 1B:
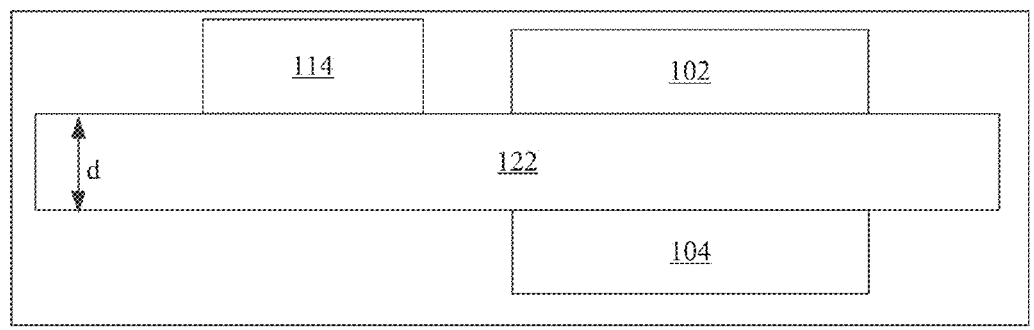
FIG. 1B shows a cross-sectional side view of a sensor system mounted on a support element in accordance with the described embodiments.

FIG. 1B shows one embodiment in which first magnetic sensor 102 and second magnetic sensor 104 are mounted on a support element 122. Support element 122 can be a planar substrate configured to support electronic components. For example, support element 122 can include a printed circuit board (PCB) such that first magnetic sensor 102 and the second magnetic sensor 104 are mounted on opposing sides of PCB 122. In one aspect of the embodiment, the magnetic sensors 102, 104 are mounted directly opposite of each other on the PCB 122. PCB 122 can support other electronics parts such as processor 114. Consequently, the thickness of PCB 122 can determine the distance between first magnetic sensor 102 and second magnetic sensor 104 (distance "d"). In one aspect of the embodiment, the sensor system can determine a location of a magnetic source with respect to the opposing sides of PCB 122.

Figure 2A:
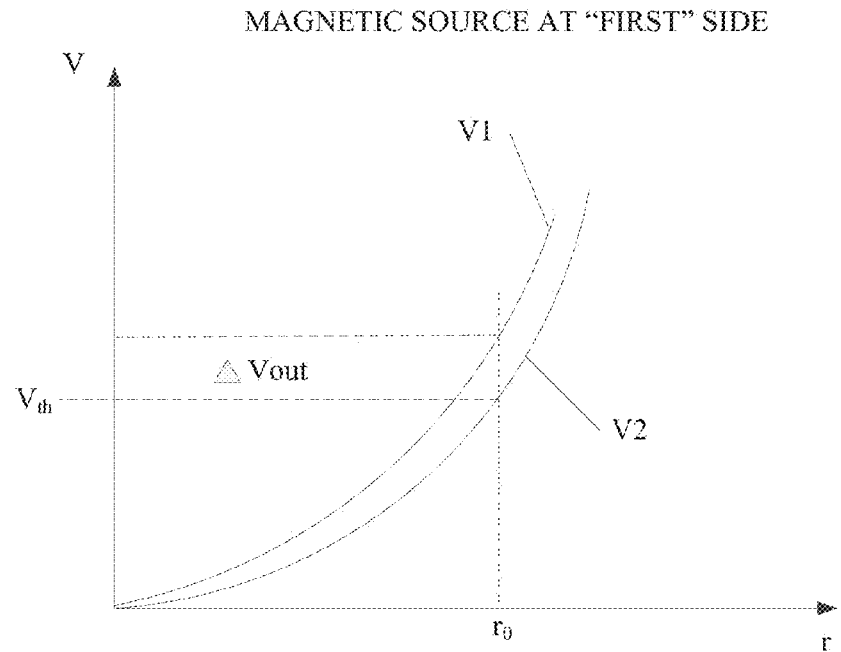
FIG. 2A shows a graph illustrating voltage responses of the sensor system of FIG. 1A to an externally applied magnetic field.
Figure 2B:
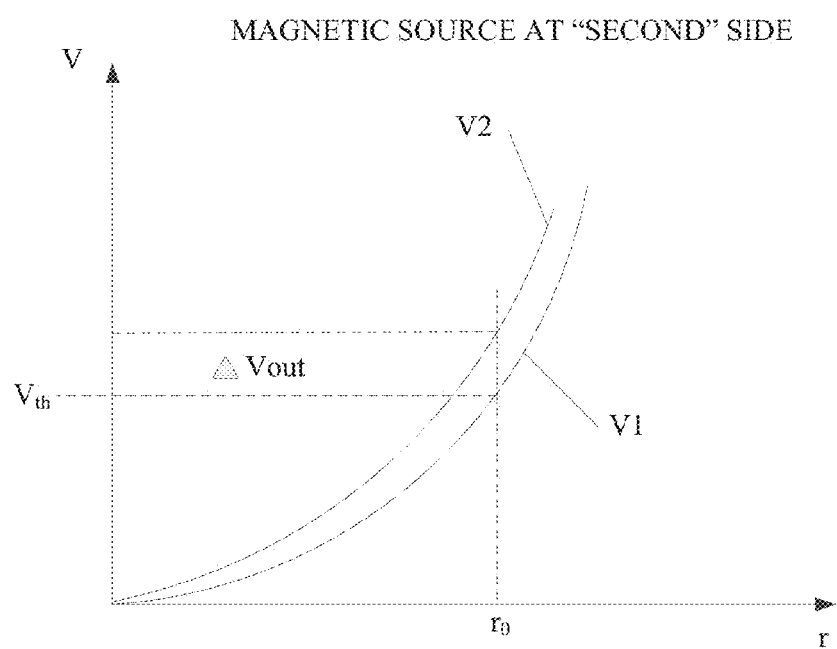
FIG. 2B shows a graph illustrating voltage responses of the sensor system of FIG. 1A to an externally applied magnetic field.

FIGS. 2A and 2B show a response of sensor system 100 as magnetic source 105 approaches an exemplary sensor system 100. If magnetic source 105 is at a distance greater than $r_0$ from sensor system 100, the magnetic field incident on sensor system 100 is not sufficient to activate sensor system 100. Activation of sensor system 100 can occur when the magnetic field incident on sensor system 100 is sufficient such that both output voltages V1 and V2 exceed threshold voltage $V_{th}$. Alternatively, activation of sensor system 100 can occur when the average of output voltages V1 and V2 exceeds threshold voltage $V_{th}$, or when either output voltage V1 or V2 exceeds threshold voltage $V_{th}$. Prior to activation, processor 114 can output no signal in response to output voltages V1 and V2 and/or provide an output indicating no magnetic source is present or is too far away to provide a detectable output difference.

If magnetic source 105 is at a distance less than or equal to $r_0$ from sensor system 100, sensor system 100 activates. Upon activation, processor 114 can analyze output voltages V1 and V2 and a direction of magnetic field M with respect to sensor system 100 by measuring a difference in output voltages V1 and V2. For example, FIG. 2A shows output voltage V1 is greater than output voltage V2 at $r_0$; it can then be deduced that first magnetic sensor 102 is "closer" to magnetic source 105 than second magnetic sensor 104 because the output voltages vary inversely in accordance with distance from the magnetic source 105. In another example, FIG. 2B shows output voltage V2 is greater than output voltage V1 at $r_0$; it can then be deduced that second magnetic sensor 104 is "closer" to magnetic source 105 than first magnetic sensor 102 because the output voltages vary inversely in accordance with distance from the magnetic source 105. In this way, a determination of a direction of magnetic field M with respect to sensor system 100 can be based in part upon a determination of the value of a "voltage gap" ($\Delta$Vout). When such a determination is made, sensor system 100 can then indicate a location of magnetic source 105 with respect to the "first" and "second" sides of sensor system 100.

Figure 2C:
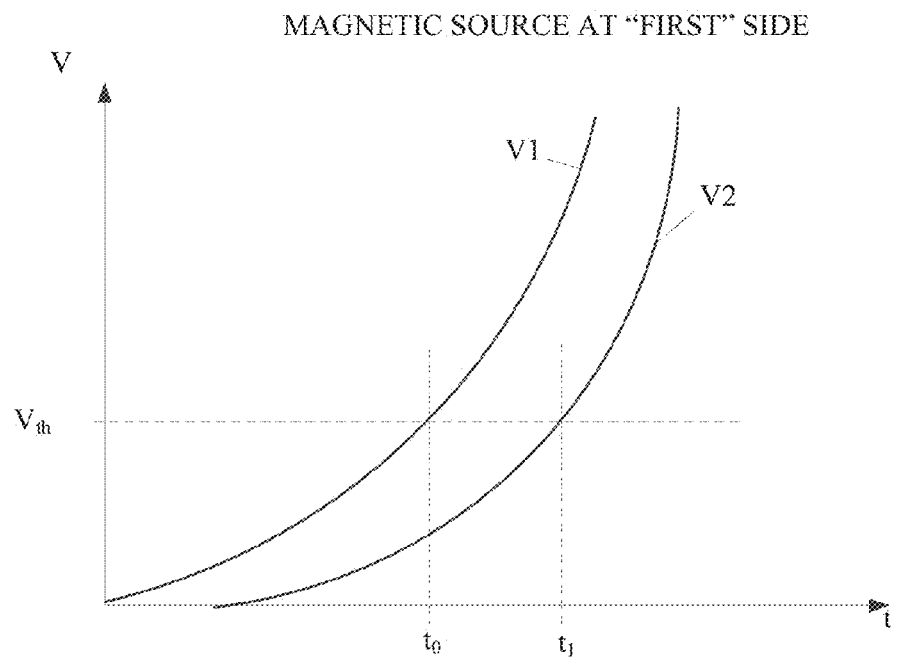
FIG. 2C shows a graph illustrating voltage responses of the sensor system of FIG. 1A to an externally applied magnetic field.
Figure 2D:
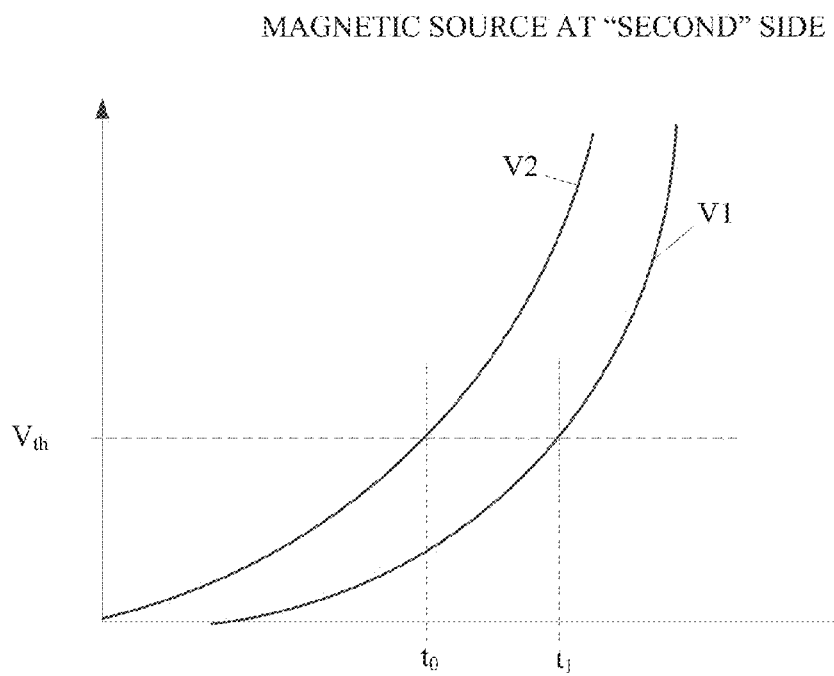
FIG. 2D shows a graph illustrating voltage responses of the sensor system of FIG. 1A to an externally applied magnetic field.

FIGS. 2C and 2D show a depiction of detection signals associated with sensor system 100 as a magnetic source approaches sensor system at a particular velocity. Sensor system 100 can determine a direction of magnetic field M with respect to time as magnetic source 105 approaches sensor system 100. As shown in FIG. 2C, output voltage V1 exceeds $V_{th}$ (V1>$V_{th}$) at time $t_0$ (i.e. first magnetic sensor 102 activates) and output voltage V2 exceeds $V_{th}$ (V2>$V_{th}$) at a later time $t_1$ (i.e. second magnetic sensor 104 activates). Processor 114 can be configured to determine which output voltage V1 or V2 exceeded $V_{th}$ first and determine a direction of magnetic field M. For example, a comparator within processor 114 can compare $t_0$ and $t_1$; if $t_0$ is less than $t_1$ then output voltage V1 exceeds $V_{th}$ before output voltage V2 exceeds $V_{th}$, it can then be deduced that first magnetic sensor 102 is "closer" to magnetic source 105 than second magnetic sensor 104 because the output voltages vary inversely in accordance with distance from the magnetic source 105. In another example, output voltage V2 exceeds $V_{th}$ before output voltage V1 exceeds $V_{th}$ as shown in FIG. 2D; it then can be deduced that second magnetic sensor 104 is "closer" to magnetic source 105 than first magnetic sensor 102. In this way, a determination of a direction of magnetic field M with respect to sensor system 100 can be based in part upon which magnetic sensor activates first. When such a determination is made, sensor system 100 can then indicate a location of magnetic source 105 with respect the "first" and "second" sides of sensor system 100.

Figure 2E:
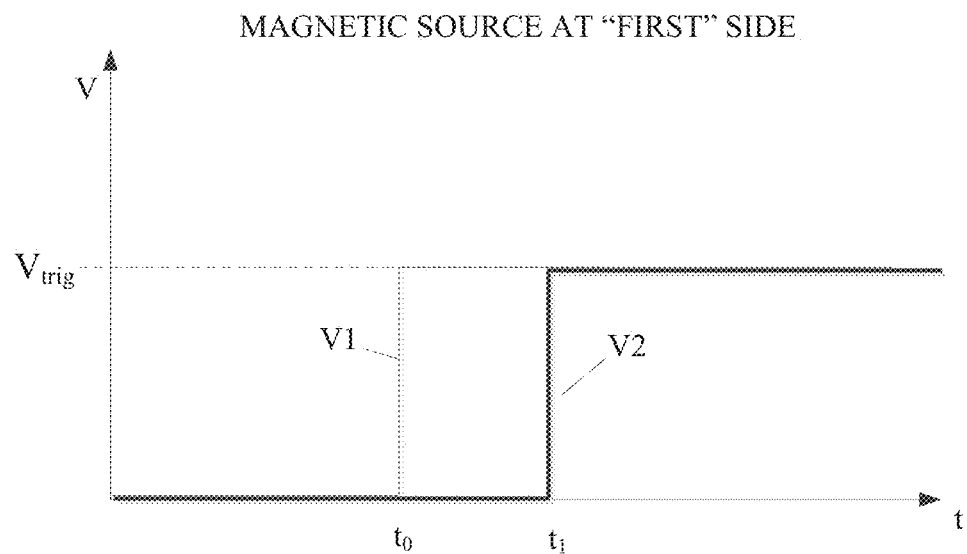
FIG. 2E shows a graph illustrating voltage responses of digital magnetic sensors in accordance with an alternative embodiment.
Figure 2F:
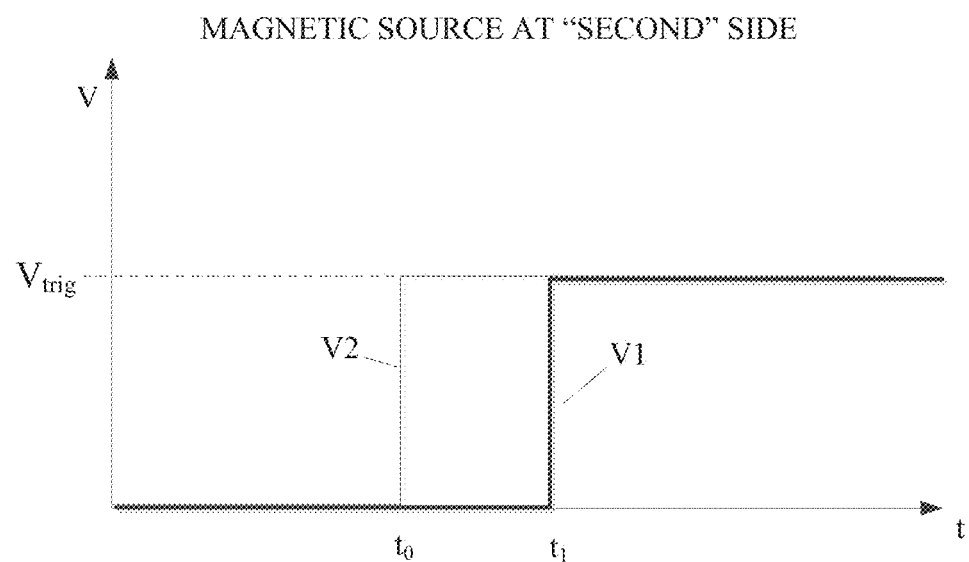
FIG. 2F shows a graph illustrating voltage responses of digital magnetic sensors in accordance with an alternative embodiment.

FIGS. 2E and 2F show a response of sensor system 100 when first magnetic sensor 102 and second magnetic sensor 104 are digital magnetic sensors. One example of a digital magnetic sensor is a reed switch magnetic sensor. Reed switch magnetic sensors trigger when a magnetic field value exceeding a threshold value is sensed. Referring to FIG. 2E, first magnetic sensor 102 triggers at time $t_0$ and second magnetic sensor 104 triggers at a later time at time $t_1$. Similar to the embodiments of FIGS. 2C and 2D, processor 114 can be configured to determine a direction of magnetic field M with respect to sensor system 100 based in part upon which magnetic sensor triggers first. For example, if first magnetic sensor 102 triggers before second magnetic sensor 104 triggers (FIG. 2C), then it can be deduced that first magnetic sensor 102 is "closer" to magnetic source 105 than second magnetic sensor 104 because the magnetic field value incident on a digital magnetic sensor varies inversely in accordance with distance from magnetic source 105. In another example, second magnetic sensor 104 triggers before first magnetic sensor 102 triggers as shown in FIG. 2F; it then can be deduced that second magnetic sensor 104 is "closer" to magnetic source 105 than first magnetic sensor 102. Furthermore, sensor system 100 can then indicate a location of magnetic source 105 with respect the "first" and "second" sides of sensor system 100 based upon the detected magnetic field M direction. This detection scheme is well suited for digital magnetic sensors because the output voltages of identical digital magnetic sensors after triggering ($V_{trig}$) are substantially equal. Therefore, comparing output voltages V1 and V2 in accordance with the techniques described for FIGS. 2A and 2B would not work because the difference in output voltages after each digital magnetic sensor triggered would be undetectable.

Figure 2G:
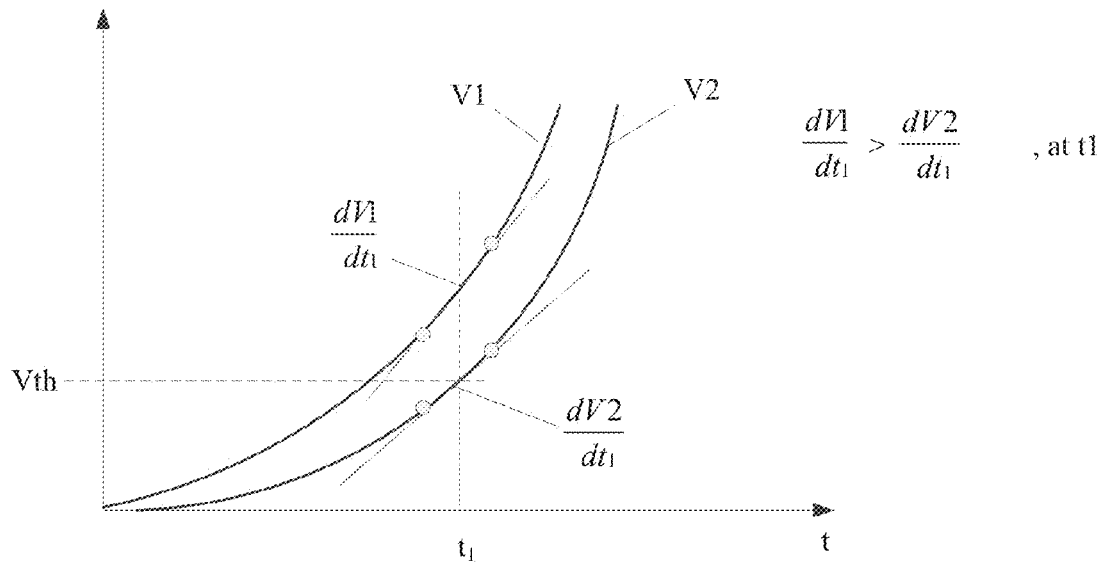
FIG. 2G shows a graph illustrating a comparison of the rate of changes in voltage responses.
Figure 2H:
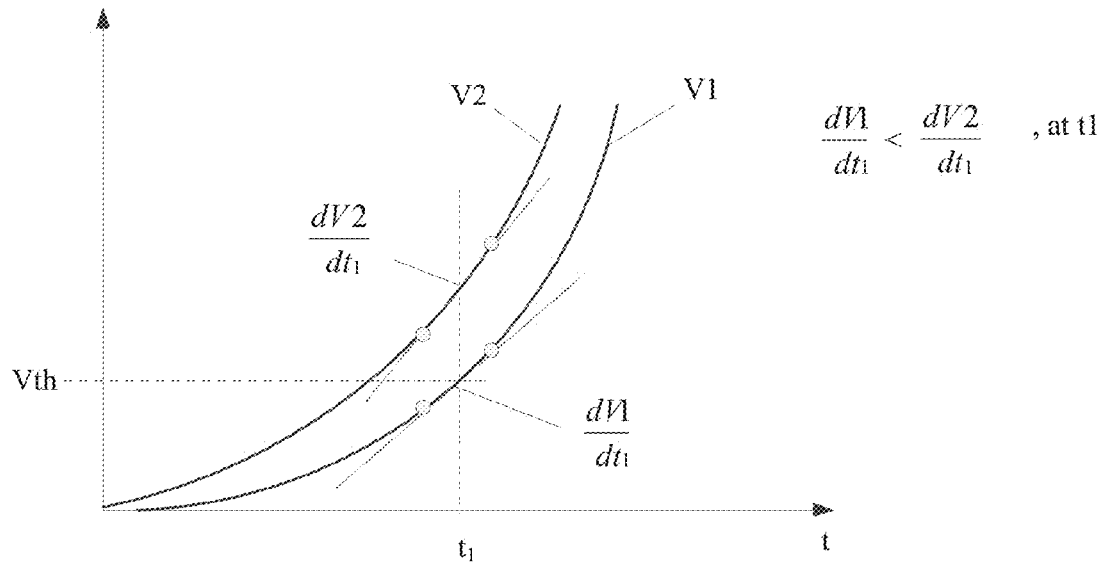
FIG. 2H shows a graph illustrating a comparison of the rate of changes in voltage responses.

FIG. 2G and FIG. 2H shows how sensor system 100 can determine a direction of magnetic field M by comparing the rate of change of output voltages V1 and V2 as magnetic source 105 approaches sensor system 100 at a particular velocity. Sensor system 100 can determine the rate of change $$\frac{dV1}{dt} \text{ and } \frac{dV2}{dt}$$

at a particular time. For example, processor 114 can continuingly receive and analyze output voltages V1 and V2 before and after threshold voltage $V_{th}$ is achieved at $t_1$. Furthermore, processor 114 can include a differentiator circuit to determine the rate of change $$\frac{dV1}{dt1} \text{ and } \frac{dV2}{dt1}$$

at time $t_1$. Then a comparator can be used to compare $$\frac{dV1}{dt1} \text{ and } \frac{dV2}{dt1}.$$

If the rate of change $$\frac{dV1}{dt1}$$

is greater than the rate of change $$\frac{dV2}{dt1}$$

then it can be deduced that first magnetic sensor 102 is "closer" to magnetic source 105 than second magnetic sensor 104 as shown in FIG. 2G. Furthermore, if the rate of change $$\frac{dV1}{dt1}$$

is less than the rate of change $$\frac{dV2}{dt1}$$

then it can be deduced that second magnetic sensor 104 is "closer" to magnetic source 105 than first magnetic sensor 102 as shown in FIG. 2H. Consequently, knowing which magnetic sensor is closer to magnetic source 105 can indicate if the magnetic source 105 is at the "first" or the "second" side of sensor system 100. In some embodiments, differentiator circuitry can be used to verify a direction magnetic field M initially determined by comparing values of V1 and V2 (in accordance with the techniques described for FIG. 2A). When magnetic source 105 is in motion with respect to sensor system 100, values of V1 and V2 can fluctuate rapidly, thereby making the rate of change comparison more accurate in some cases where magnetic source 105 is being moved quickly.

Figure 3A:
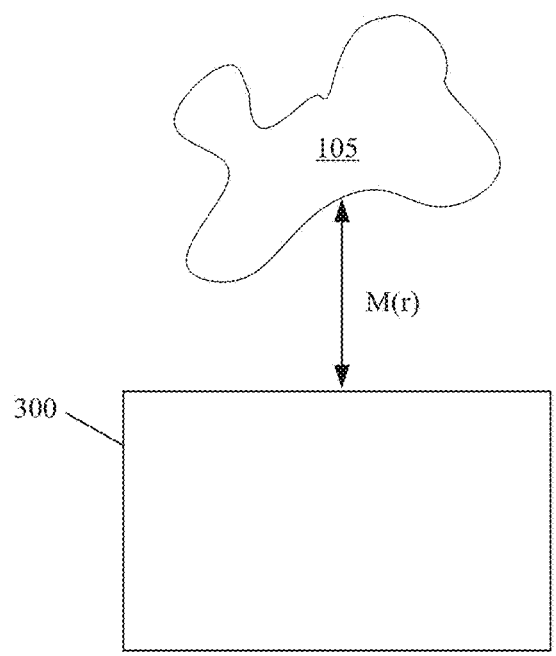
FIG. 3A shows a side view of a sensor system and a magnetic source in an initial alignment in accordance with an alternative embodiment.

FIG. 3A shows a side view of sensor system 300 and magnetic source 105 according to one embodiment. The design, form factor and dimensions of magnetic source 105 can be non-uniform and varied. Accordingly it can emit a seemingly complex and varied magnetic field (not shown). In some cases, it is difficult to ascertain the characteristics of the magnetic field. For example, portions of the magnetic field can have non-symmetrical or non-uniform magnetic flux densities and magnetic field strengths. In another example, the magnetic field emitted from magnetic source 105 is transient and/or dynamic such as in the case when magnetic source 105 is electromagnet. In another example, magnetic source 105 is formed from various magnetic materials with varying magnetic properties and characteristics, resulting in a complex magnetic field. Despite the seemingly complex nature of the magnetic field, the magnetic field strength still varies inversely with distance from the magnetic source. Accordingly, the magnetic strength incident at sensor system 300 is a function, M(r), of the distance between sensor system 300 and magnetic source 105. Accordingly, a particular magnetic field strength is incident at sensor system 300 when sensor system 300 and magnetic source 105 are aligned at a distance r as shown in FIG. 3A. A magnetic field strength change experienced at sensor system 300 when rotating the magnetic field with respect to sensor system 300 can be due to, at least in part, bringing a portion of sensor system 300 closer to a portion of magnetic source 105.

Figure 3B:
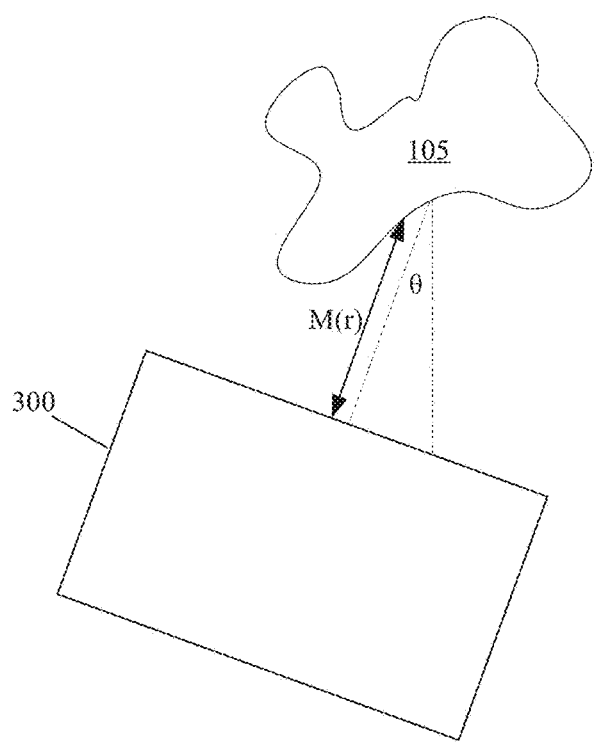
FIG. 3B shows a side view the sensor system of FIG. 3A when aligned at an angle relative to a magnetic source.

FIG. 3B shows sensor system 300 aligned at an arbitrary angle theta, θ, relative to magnetic source 105 according to one embodiment. When sensor system 300 is aligned at θ, magnetic field will be rotated with respect to sensor system 300. Consequently the magnetic field strength at sensor system 300 in FIG. 3B will be different relative to the magnetic field strength at sensor system 300 in FIG. 3A. This can be due in part to the distance between a portion of magnetic source 105 and sensor system 300 changing. The following examples will describe how a sensor system can be configured to utilize the magnetic field strength changes experienced at the sensor system as a result of when alignment between a magnetic source and the sensor system varies. More particularly the following examples show how the sensor system can be configured to provide an increase in the detectable output difference between two magnetic sensors of the sensor system when the alignment varies.

Figure 3C:
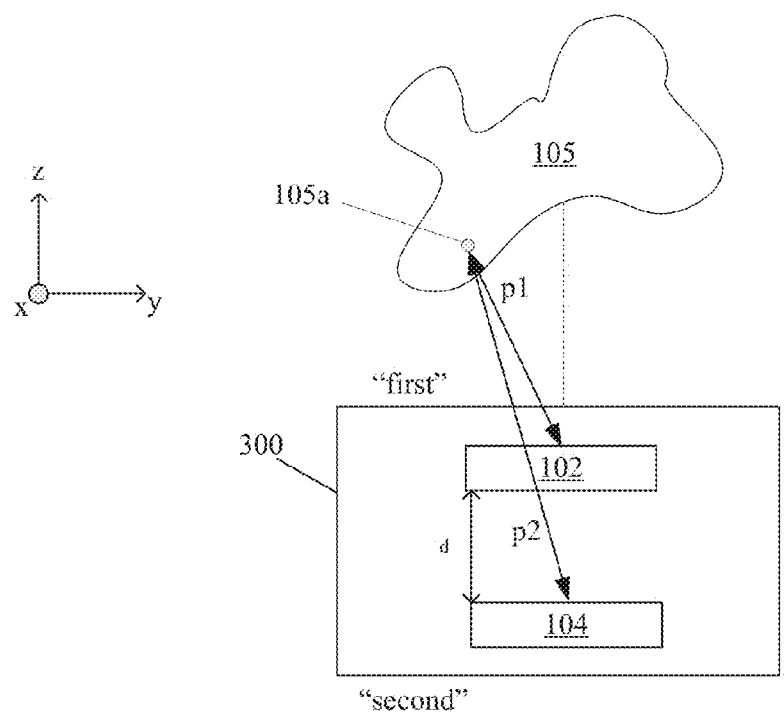
FIG. 3C shows a cross-sectional side view of a sensor system and a magnetic source arranged the initial alignment of FIG. 3A.

FIG. 3C shows a cross-sectional view of an exemplary embodiment of sensor system 300 with magnetic source 105 at the "first" side of sensor system 300. In this embodiment, sensor system 300 includes first magnetic sensor 102 and a second magnetic sensor 104 stacked directly atop each other at a distance d. Other components such as the processor or amplifiers are not shown only for conciseness and clarity. Magnetic source 105 comprises a portion 105a. Portion 105a emits a portion of the magnetic field emitted from magnetic source 105. FIG. 3C shows an initial alignment between sensor system 300 and magnetic source 105. In this initial alignment, first magnetic sensor 102 is at distance p1 from portion 105a and second magnetic sensor 104 is at distance p2 from portion 105a. Furthermore, the magnetic field strength in accordance to the portion of magnetic field emitted by portion 105a varies inversely with distance. The principle that the magnetic field strength varies inversely with distance is applicable to any portion or section of magnetic source 105. Therefore, although the following discussion is with respect to portion 105a, it is understood that the discussion is applicable to any portion(s) of magnetic source 105 including the entirety of magnetic source 105.

Figure 3D:
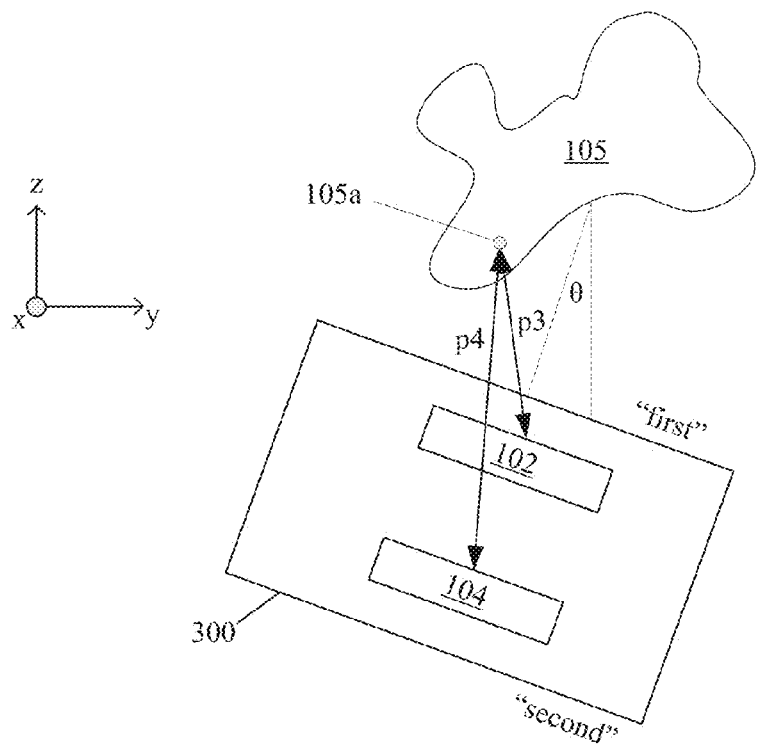
FIG. 3D shows a cross-sectional side view of the sensor system of FIG. 3A when aligned at an angle relative to a magnetic source.

FIG. 3D shows sensor system 300 when it is aligned at arbitrary angle θ relative to magnetic source 105 within the z-y plane. In this alignment first magnetic sensor 102 is at distance p3 from portion 105a and second magnetic sensor 104 is at distance p4 from portion 105a. Note that in this alignment, first and second magnetic sensors 102 and 104 can be closer to portion 105a; that is, p3<p1 and p4<p2. Accordingly, since both the first and second magnetic sensors 102 and 104 are closer to portion 105a, the magnetic field strength emitted from portion 105a incident on both magnetic sensors will increase. However, since both magnetic sensors will experience an increase, the detectable output difference between the magnetic sensors does not necessarily increase. For example, if the rotation causes both magnetic sensors outputs to increase by substantially the same voltage, the output difference does not increase since the "voltage gap" is a difference between each magnetic sensor output (i.e. $\Delta V_{out}=V1-V2$).

Figure 3E:
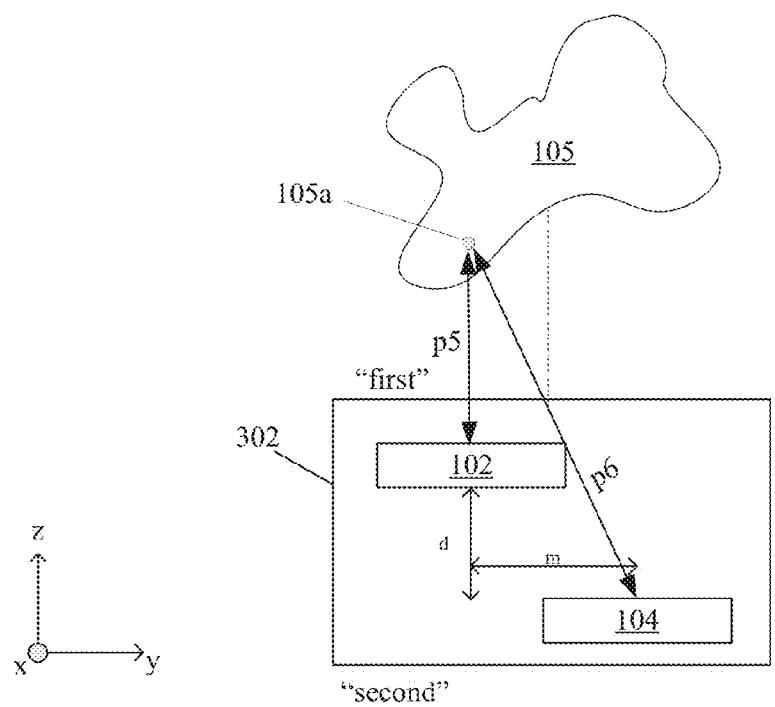
FIG. 3E shows a cross-sectional side view of a sensor system and magnetic source in accordance with an alternative embodiment.

FIG. 3E shows a cross-sectional side view of sensor system 302 in accordance with the described embodiments. Sensor system 302 is similar to sensor system 300, however sensor system 302 differs from sensor system 300 in that first and second magnetic sensors 102, 104 are not stacked directly atop each other, but offset from each other a distance 'm' in the y-axis and a distance 'd' in the z-axis. The distance 'm' can distance magnetic sensors 102 and 104 so that at least a portion of each magnetic sensor overlaps each other with respect to the z-axis. Alternatively, the distance 'm' can be larger enough to offset magnetic sensors 102 and 104 such that the magnetic sensors do not overlap each other with respect to the z-axis. First magnetic sensor 102 is now a distance p5 from portion 105a and second magnetic sensor 104 is now a distance p6 from portion 105a. Due to the offset, the distance between first magnetic sensor 102 and portion 105a has decreased with respect to when no offset is present at initial alignment (e.g. sensor system 300 of FIG. 3C); that is, p5<p1. Additionally, the distance between second magnetic sensor 104 and portion 105a has increased with respect to when no offset is present at initial alignment (e.g. sensor system 300 of FIG. 3C); that is, p6>p2.

Figure 3F:
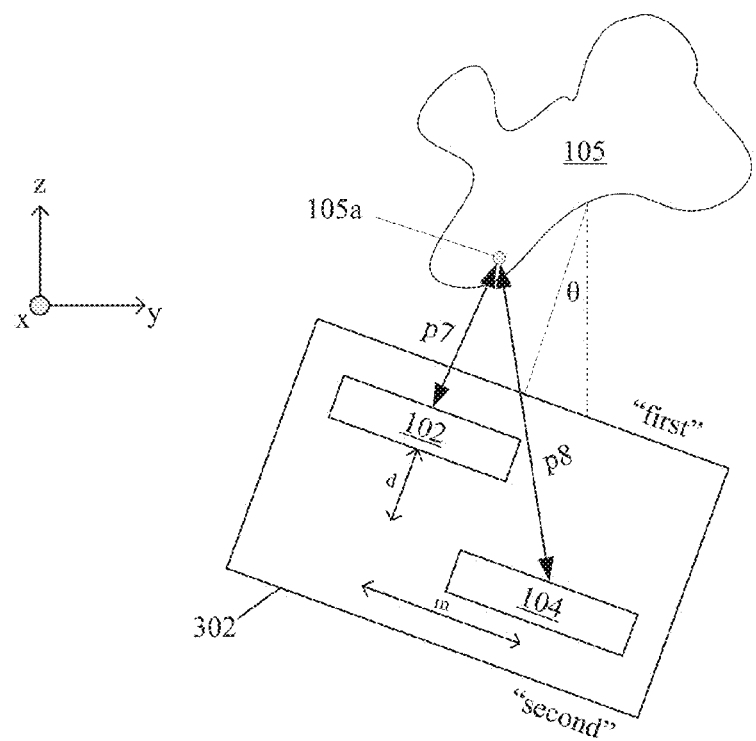
FIG. 3F shows a cross-sectional side view of the sensor system of FIG. 3E when aligned at an angle relative to a magnetic source.

FIG. 3F shows sensor system 302 and magnetic source 105 in an alignment similar to the embodiment of FIG. 3D. Accordingly, sensor system 302 is aligned at angle θ relative to magnetic source 105 within the z-y plane. First magnetic sensor 102 is now a distance p7 from portion 105a and second magnetic sensor 104 is now a distance p8 from portion 105a. Due to the offset, the distance between first magnetic sensor 102 and portion 105a has decreased with respect to when no offset is present (e.g. sensor system 300 of FIG. 3D); that is, p7<p3. Additionally, the distance between second magnetic sensor 104 and portion 105a has increased with respect to when no offset is present (e.g. sensor system 300 of FIG. 3D); that is, p8>p4. Accordingly, first magnetic sensor 102 is now closer and second magnetic sensor 104 is now farther from portion 105a. Consequently, the magnetic field strength in accordance with portion 105a at first magnetic sensor 102 increases and the magnetic strength at second magnetic sensor 104 decreases because magnetic field strength varies inversely with distance. Output voltage V1 will increase and output voltage V2 will decrease, effectively improving sensor system 201 by increasing the detectable output difference between magnetic sensors 102, 104 (e.g. "voltage gap"). Although the discussion in accordance with FIGS. 3C-3F was described with respect to rotating a sensor system with respect to a magnetic source, it will be appreciated that the discussion is also applicable when a magnetic source is rotated relative to a sensor system.

Figure 3G:
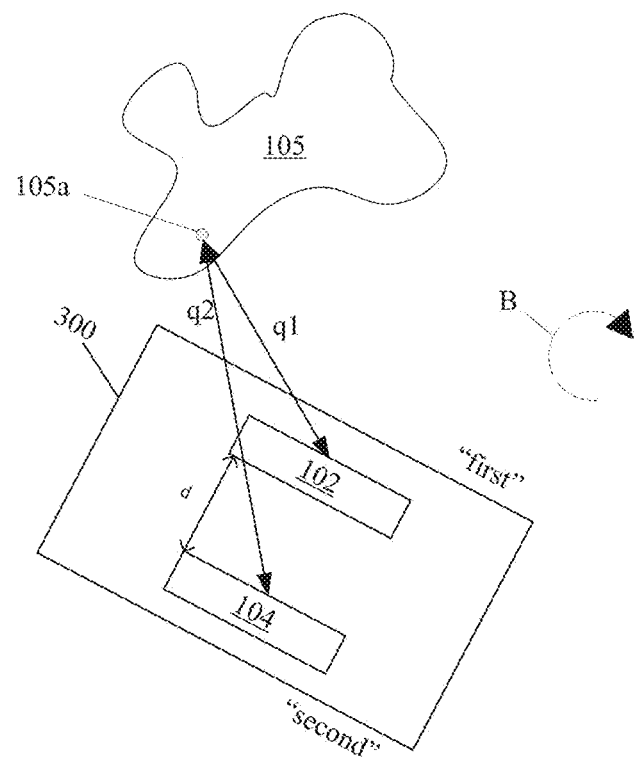
FIG. 3G shows a cross-sectional side view of the sensor system of FIG. 3C when rotated and a magnetic source.

FIG. 3G shows sensor system 300 of FIG. 3C rotated clockwise at an arbitrary angle as indicated by arrow B while magnetic source 105 is stationary with respect to sensor system 300. Although the following discussion is with respect to rotating a sensor system clockwise, it can be appreciated the following is also is applicable to rotation counterclockwise. By rotating the sensor system 300, the distance between first magnetic sensor 102 and portion 105a, q1, can increase while the distance between second magnetic sensor 104 and portion 105a, q2, can decrease with respect to the distances of FIG. 3C. That is, q1>p1 and p2<q2. Accordingly the "voltage gap" will decrease, effectively degrading the sensor's ability to detect an output difference between the magnetic sensors.

Figure 3H:
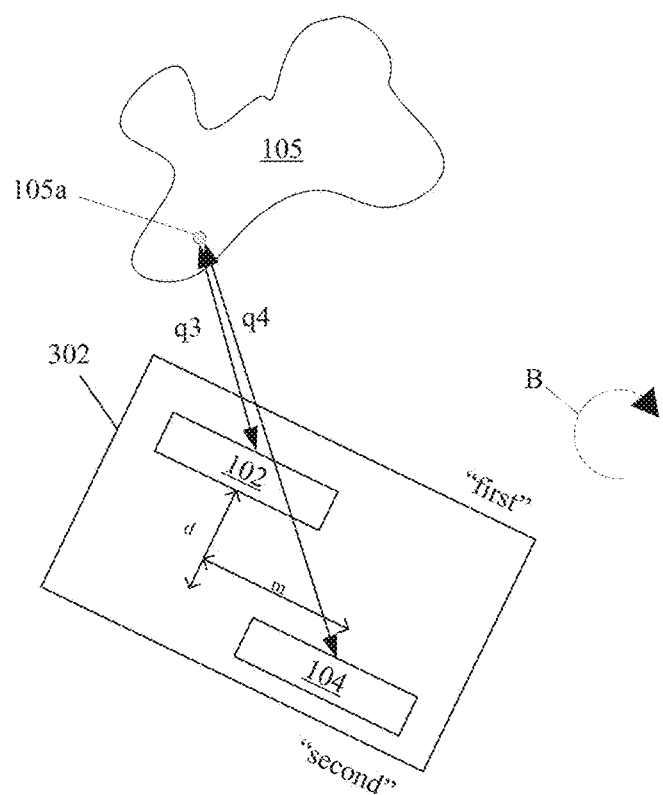
FIG. 3H shows a cross-sectional side view of the sensor system of FIG. 3E when rotated and a magnetic source.

FIG. 3H is similar to FIG. 3G but with sensor system 302 in place of sensor system 300. First magnetic sensor 102 is now a distance q3 from portion 105a and second magnetic sensor 104 is now a distance q4 from portion 105a. Due to the offset, the distance between first magnetic sensor 102 and portion 105a has decreased with respect to when no offset is present (e.g. sensor system 300 in FIG. 3G) and with respect to when there is no offset and no sensor system rotation (e.g. sensor system 300 in FIG. 3C); that is, q3<q2<p1. Additionally, the distance between second magnetic sensor 104 and portion 105a has increased with respect to when no offset is present (e.g. sensor system 300 of FIG. 3D) and with respect to when there is no offset and no sensor system rotation (e.g. sensor system 300 in FIG. 3C); that is, p8>p4>p2. Accordingly, first magnetic sensor 102 is now is closer and second magnetic sensor 104 is now farther to portion 105a. Consequently the magnetic field strength at first magnetic sensor 102 increases and the magnetic field strength at second magnetic sensor 104 decreases because magnetic field strength varies inversely with distance. Output voltage V1 will increase and output voltage V2 will decrease, effectively increasing the detectable output difference between magnetic sensors 102, 104 (e.g. "voltage gap"). Although the discussion in accordance with FIGS. 3C-3H was described with respect to magnetic source 105 being at a "first" side of a sensor system, it will be appreciated that the discussion is also applicable when the magnetic source 105 is at a "second" side of a sensor system. Furthermore, the discussion is also applicable to when magnetic source is rotated at an arbitrary angle while the sensor system is stationary.

Figure 3I:
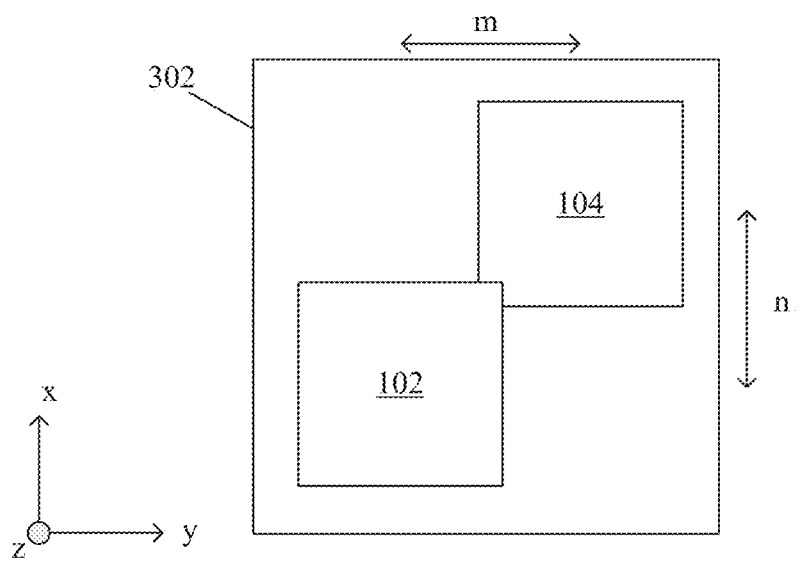
FIG. 3I shows a cross-sectional top view of an exemplary embodiment of the sensor system of FIG. 3E.

FIG. 3I shows a cross-sectional top view of sensor system 302 in the x-y plane according to one embodiment. First and second magnetic sensors 102 and 104 are also offset a distance "n" in the x-axis in addition to the offset distance "m" in the y-axis. Accordingly, first and second magnetic sensors 102 and 104 can be offset a distance from each other within the x-y plane. The offset distance "n" in the x-axis between the sensors 102, 104 can provide the same advantages as discussed above for offset distance "m" in the y-axis. For example, sensor system 302 can be aligned at an arbitrary angle α relative to magnetic source 105 within the z-x plane. Hence, increasing the detectable output difference between magnetic sensors can be accomplished in part by various offsets between the magnetic sensors, particularly when the sensor system is aligned at arbitrary angles relative to the magnetic source (and vice versa). Other considerations for selecting the values of "d," "m," or "n" can include the sensitivity of the magnetic sensors, the strength and/or size of the magnetic source, the shape/density of a portion of the magnetic field, the expected angle or orientation the magnetic source will come in proximity to the sensor system, the expected speed the magnetic source will come in proximity to the sensor system, the desired distance "r" required to trigger the sensor system, and the packaging size of the sensor system.

The described embodiments of sensor system 302 which includes various sensor offsets can be beneficial in a number of situations. In some cases, it can be difficult to control the orientation of the magnetic source relative to the sensor system and/or the orientation of the sensor system relative to the magnetic source when they come into proximity to each other. For example, magnetic source 105 can be disposed in a cover made from stretchable material such as cloth or rubber. The cover can be pivotally attached to an electronic device within which sensor system 302 is disposed. In its desired position, the magnetic source 105 is disposed in the cover such that it is orientated to be desirably aligned (θ=0) with a first surface of sensor system 302 when the cover covers the electronic device. Over time, the stretchable material can wear and deform, shifting the magnetic source from its desired position and/or orientation. The previously disclosed offsets between magnetic sensors can provide a greater tolerance of magnetic source orientation when the magnetic source is in the proximity of the sensor system because a misalignment in magnetic source orientation can result in an increase in output difference between voltages V1 and V2. Consequently, such arrangements can provide increased reliability for sensor system 302.

In addition to the offset distance(s) between each sensor, the sensitivity of the sensor system (i.e. the ability to detect an output difference between the magnetic sensors) can also be improved by changing the magnetic field values near at least one magnetic sensor. Accordingly, the change in magnetic field value near at least one magnetic sensor can increase the distinguishable difference between each sensor output. This is particularly useful when a packaging specification can cause a distance offset between the magnetic sensors to be so small that a resulting "voltage gap" is too small to detect. Changing the magnetic field value near at least one magnetic sensor can be accomplished by disposing magnetically sensitive materials, such as a shunt or magnetic absorber, within a sensor system.

Figure 4A:
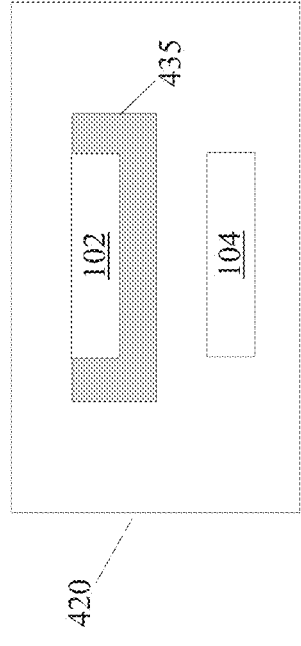
FIG. 4A shows a cross-sectional side view of a sensor system in accordance with an alternative embodiment.
Figure 4B:
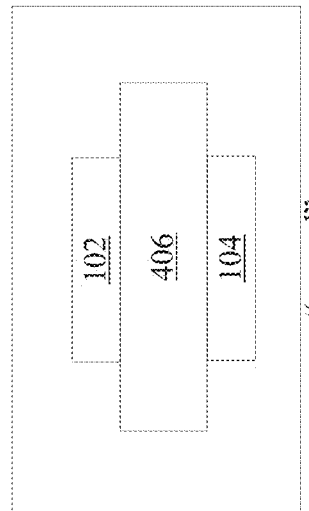
FIG. 4B shows a cross-sectional side view of a sensor system in accordance with an alternative embodiment.

FIG. 4A shows one embodiment in which a magnetic absorber 406 is disposed between first magnetic sensor 102 and second magnetic sensor 104. Magnetic absorber 406 can be dimensioned to be longer than at least one magnetic sensor. Alternatively magnetic absorber 406 can be dimensioned to be shorter or smaller than at least one magnetic sensor and/or be partially disposed between first magnetic sensor 102 and second magnetic sensor 104 as shown in FIG. 4B. Magnetic absorber 406 can also support first magnetic sensor 102 and second magnetic sensor 104 within the packaging of sensor system 410.

Magnetic absorber 406 can be configured to change the direction and/or reduce the strength of the magnetic field. In some embodiments magnetic absorber can be an iron shunt. By disposing magnetic absorber 406 between first magnetic sensor 102 and second magnetic sensor 104, magnetic absorber 406 can act as a magnetic shield, partially shielding first magnetic sensor 102 or second magnetic sensor 104 from a magnetic field. For example, if a magnetic source is closer to first magnetic sensor 102 (i.e. magnetic source is at the "first" side of the sensor system), magnetic absorber 406 will partially shield second magnetic sensor 104 from the magnetic field. Consequently, if the magnetic source is closer to second magnetic sensor 102 (i.e. magnetic source is at the "second" side of the sensor system), magnetic absorber 406 will partially shield first magnetic sensor 102 from the magnetic field. If first magnetic sensor 102 and second magnetic sensor 104 have substantially the same magnetic sensitivity, magnetic absorber 406 will reduce the magnetic field value at or near the farthest magnetic sensor, increasing the difference in output voltages V1 and V2. The location of magnetic absorber 406 relative to first magnetic sensor 102 and second magnetic sensor 104 can be configured to optimize the difference between first detection signal 106 and second detection signal 108 for any corresponding distance "d" and/or distance "r."

Figure 4C:
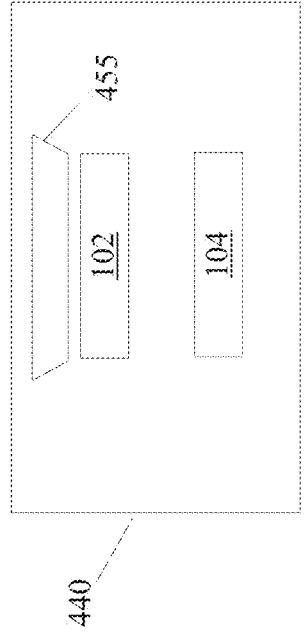
FIG. 4C shows a cross-sectional side view of a sensor system in accordance with an alternative embodiment.

FIG. 4B shows a cross-sectional view of a sensor system 430 in accordance with another embodiment. Sensor system 430 includes a first magnetic absorber 435 configured to reduce the magnetic field near first magnetic sensor 102 when a magnetic source is located at the "second" side of sensor system 430. First magnetic absorber 435 can be coupled to first magnetic sensor 102 or can be a separate component near the first magnetic sensor 102. For example, first magnetic absorber 435 can include a system of one or more shunts. The shunt system can be coupled directly to first magnetic sensor 102 or be separate components disposed near first magnetic sensor 102. The shunts can be dimensioned and shaped to surround a portion of the first magnetic sensor 102. FIG. 4C shows a second magnetic absorber 445 disposed at second magnetic sensor 104. Similar to the phenomenon described in accordance with first magnetic absorber 435, the second magnetic absorber 445 is configured to reduce the magnetic field near second magnetic sensor 104 when a magnetic source is at the "first" side of sensor system 430. Accordingly, magnetic absorber 406 and magnetic absorbers 435,445 increase the offset between first detection signal 106 and second detection signal 108 and improves the sensor's ability to detect a direction of the magnetic field emitted from a magnetic source.

Figure 4D:
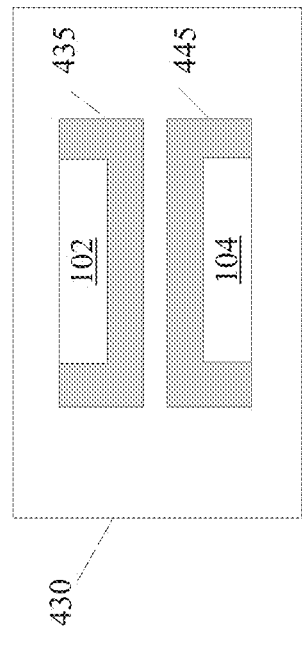
FIG. 4D shows a cross-sectional side view of a sensor system in accordance with an alternative embodiment.

An element configured to increase the magnetic field can also be disposed near or at one or more of the magnetic sensors. FIG. 4D shows another embodiment in accordance with the described embodiments. Sensor system 440 is similar to sensor system 420; however, a magnetic concentrator 455 is used in place of a magnetic absorber. Magnetic concentrator 455 is configured to increase the magnetic field at first magnetic sensor 102 when the magnetic source is at the "first" side of system 440. Similarly, a second magnetic concentrator 465 can also be disposed at or near second magnetic sensor 104 (see FIG. 4E) and configured to increase the magnetic field near second magnetic sensor 104 when the magnetic source is at the "second" side of sensor system 460.

Magnetic concentrators 455, 465 increase the magnetic field value at the magnetic sensor closest to the magnetic source. Consequently, the output of the closest magnetic sensor increases and the difference between first detection signal 106 and second detection signal 108 also increases. Hence, magnetic concentrators 455, 465 improve the sensor system's ability to detect a direction of the magnetic field.

Figure 4F:
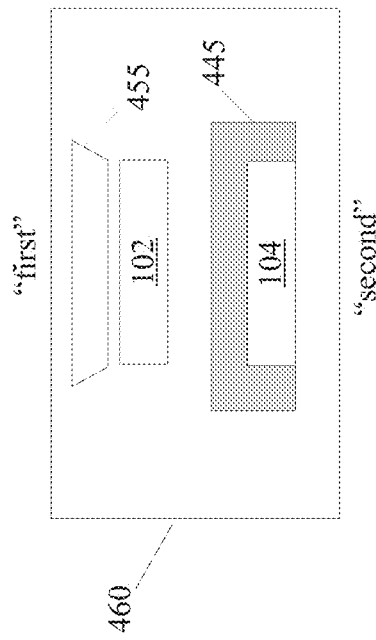
FIG. 4F shows a cross-sectional side view of a sensor system in accordance with an alternative embodiment.
Figure 4E:
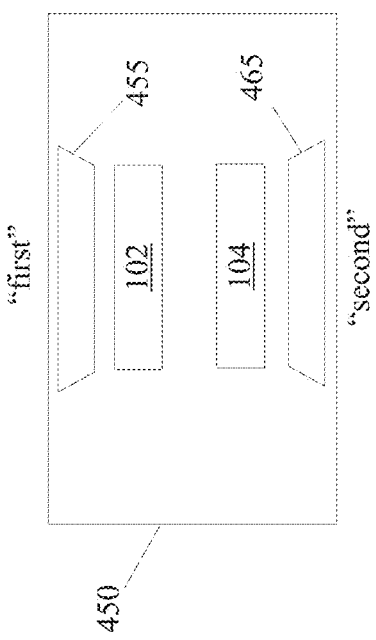
FIG. 4E shows a cross-sectional side view of a sensor system in accordance with an alternative embodiment.

A sensor system can also include a combination of magnetic absorbers and magnetic concentrators. For example, FIG. 4F shows an alternative embodiment in which sensor system 460 includes both a magnetic absorber 445 and a magnetic concentrator 455. In this embodiment, magnetic concentrator 455 increases the magnetic field at first magnetic sensor 102 while magnetic absorber 445 decreases the magnetic field at second magnetic sensor 104 when the magnetic source is at the "first" side of sensor system 460.

Figure 5A:
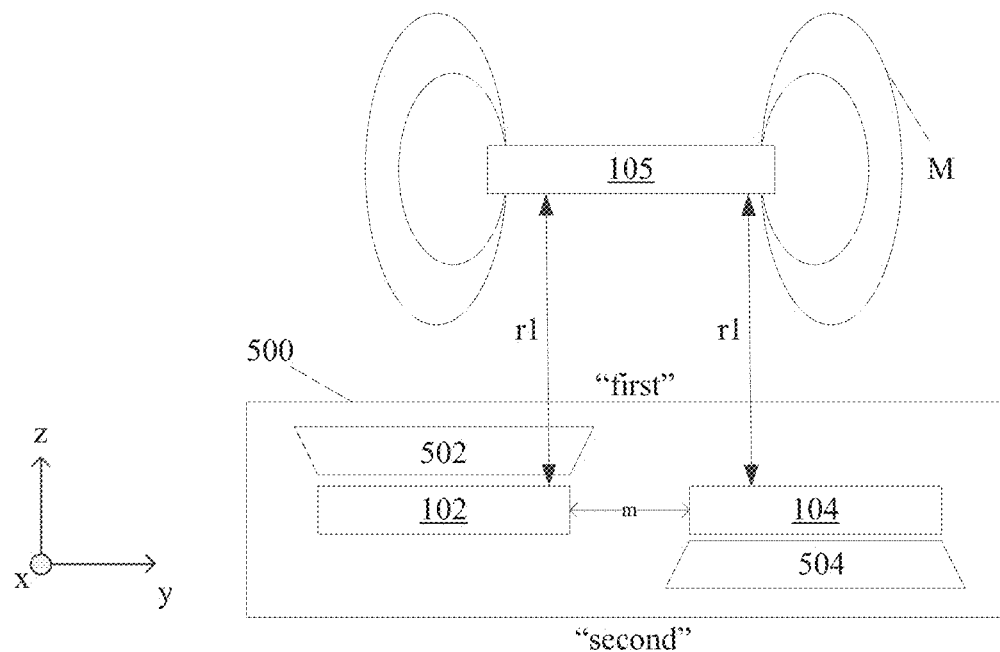
FIGS. 5A-5C show cross-sectional side views of sensor systems in accordance with alternative embodiments.

In one embodiment, the two magnetic sensors are not stacked atop of each other but rather disposed on a linear plane relative to the magnetic source. For example, the two magnetic sensors can be placed side-by-side in order to dimension the sensor system as flat as possible. FIG. 5A shows a cross-sectional view of a sensor system 500 where first magnetic sensor 102 and second magnetic sensor 104 are disposed on the same plane within the z-axis. First magnetic sensor 102 and second magnetic sensor 104 are placed side-by-side at a distance "m" apart. First magnetic sensor 102 and second magnetic sensor 104 are both a distance "r1" away from magnetic source 105.

Because magnetic sensors 102, 104 are disposed side-by-side with respect to a z-plane and both a distance "r1" from magnetic source 105, the magnetic field values sensed at magnetic sensors 102, 104 are equal. Assuming first magnetic sensor 102 and second magnetic sensor 104 are identical, the difference between output voltage V1 and output voltage V2 ($\Delta V_{out}$) would be minimal at most. Consequently, sensor system 500 would not be able to deduce a direction of the magnetic field M since there is no substantial output difference. Therefore, magnetic concentrators 502, 504 are disposed in sensor system 500 to provide the necessary output difference between the sensors.

First concentrator 502 is configured to increase the magnetic field M at first magnetic sensor 102. For example, first concentrator 502 can be a flux concentrator such as a plate configured to channel a portion of the magnetic field M toward first magnetic sensor 102. First concentrator 502 can be configured to increase a detected strength of magnetic field M at first magnetic sensor 102. Although second magnetic sensor 104 can realize an increase in detected strength of magnetic field M on account of first concentrator 502 it should be understood that the increase in magnetic field M is substantially larger at first magnetic sensor 102 when compared to magnetic sensor 104. Therefore, when magnetic source 105 is at the "first" side of sensor system 500 (as shown in FIG. 5A), the output voltage V1 is larger than output voltage V2.

Likewise, second concentrator 504 is configured to increase the magnetic field M near or at the second magnetic sensor 104, particularly when magnetic source 105 is at the "second" side of sensor system 500. Although first magnetic sensor 102 can realize an increase in detected strength of magnetic field M on account of second concentrator 504 it should be understood that the increase in magnetic field M is substantially larger at second magnetic sensor 104 when compared to first magnetic sensor 102. Consequently, when magnetic source 105 is at the "second" side of sensor system 500, output voltage V2 will be larger than output voltage V1.

Figure 5B:
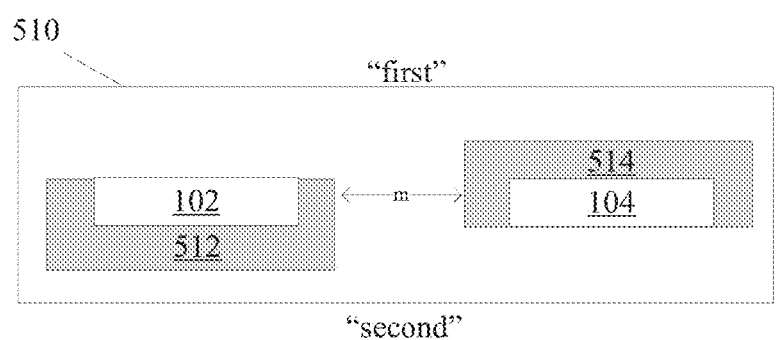
Figure 5C:
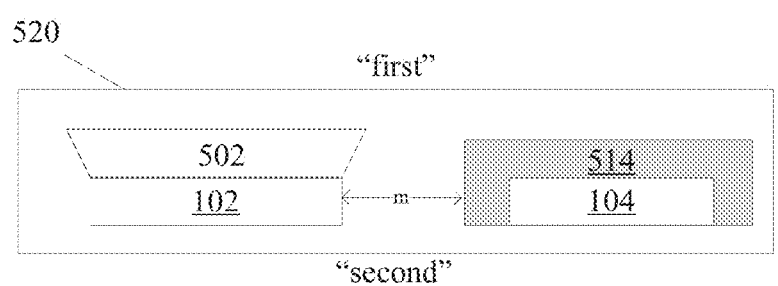

An element decreasing the magnetic field M can also be disposed near or at one or more of the magnetic sensors. FIG. 5B, shows another embodiment in accordance with the described embodiments. Sensor system 510 is similar to sensor system 500; however, the magnetic concentrators have been replaced with magnetic absorbers 512, 514. First magnetic absorber 512 is configured to decrease the magnetic field M near first magnetic sensor 102 when magnetic source 105 is at the "second" side of sensor system 510. Second magnetic absorber 514 is configured to decrease magnetic field M near second magnetic sensor 104 when magnetic source 105 is at the "first" side of sensor system 510. Like the concentrators, magnetic absorbers 512,514 change the magnetic field to provide the necessary output difference between magnetic sensors 102 and 104. FIG. 5C shows another sensor system 520 having a mix of absorbers and concentrators. The embodiment depicted in FIG. 5C can allow for smaller packaging as both the concentrator and absorber can be located on one side of sensor system 510, thereby leading to reduced height of the packaging in the Z-axis.

Figure 5D:
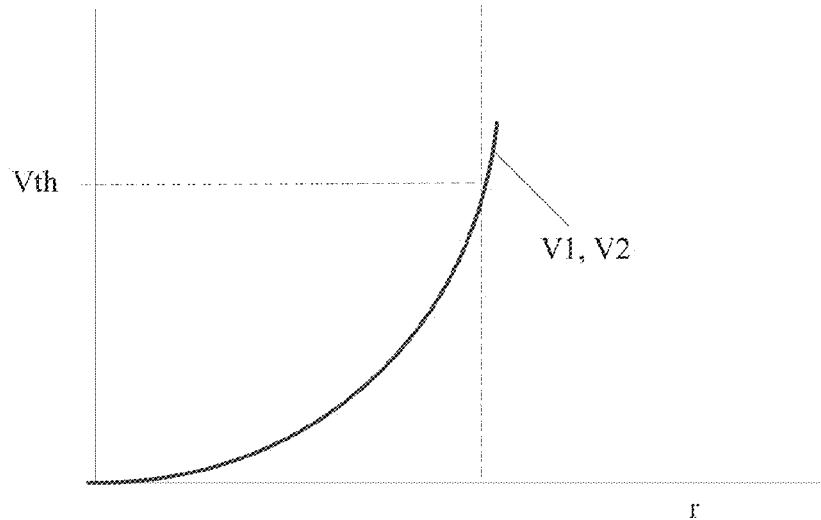
FIG. 5D shows a graph illustrating voltage responses of an exemplary embodiment of the sensor system of FIG. 5A to an externally applied magnetic field.

FIG. 5D shows the voltage responses of an exemplary embodiment of sensor system 500 when concentrators 502, 504 are not present and magnetic source 105 is at the "first" side of sensor system 500. Output voltages V1 and V2 are the output voltages of first magnetic sensor 102 and second magnetic sensor 104 respectively. As discussed above, without magnetic concentrators 502, 504 present, the output voltage of each sensor will be the same (V1=V2). Consequently, when both output voltages exceed the threshold voltage $V_{th}$, the difference in output voltages is 0 (V1−V2=0). Sensor system 500 cannot deduce a direction of the magnetic field M since the output difference is too small to detect. Although the preceding describes the case where magnetic source 105 is at the "first" side of sensor system 500, it can be appreciated a similar phenomenon occurs when magnetic source 105 is located at the "second" side of the sensor system 500.

Figure 5E:
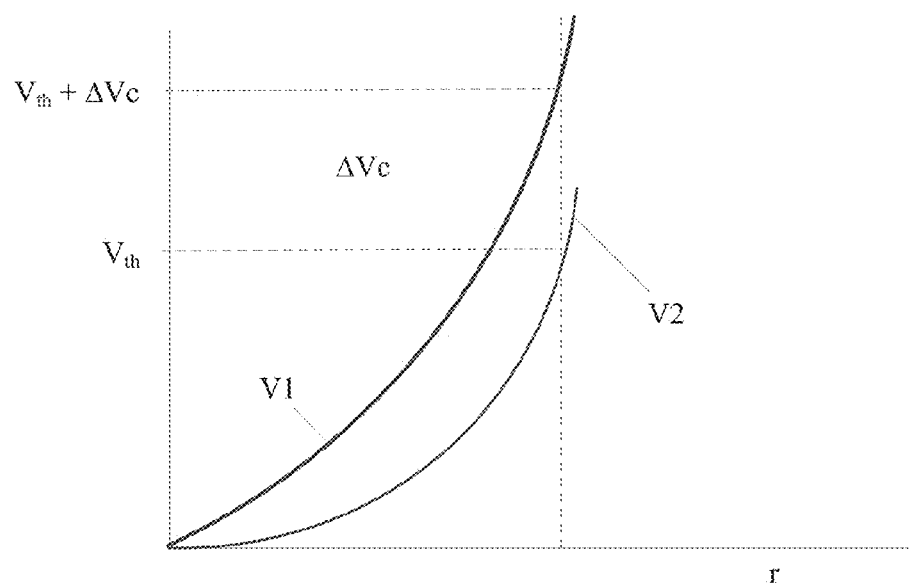
FIG. 5E shows a graph illustrating voltage responses of an exemplary embodiment of the sensor system of FIG. 5A to an externally applied magnetic field.

FIG. 5E shows the voltage responses of sensor system 500 with concentrators 502, 504 when magnetic source 105 is at the "first" side of sensor system 500. Assuming first magnetic concentrator 502 is configured to have little or insignificant effect on second magnetic sensor 104 (and vice versa), then the presence of magnetic concentrator 502 will increase the output voltage V1 of first magnetic sensor 102. For example, when the threshold voltage $V_{th}$ is exceeded by both magnetic sensors, magnetic concentrator 502 increases output voltage V1 by $\Delta Vc$. Output voltage V2 will be substantially the same when magnetic source 105 is at the "first" side of sensor system 500 regardless of the presence of magnetic concentrators 502, 504. The presence of concentrators 502, 504 results in a detectable "voltage gap" of $\Delta Vc$. Therefore, magnetic concentrator 502 provides an output difference between the sensors necessary to deduce a direction of the magnetic field M.

Magnetic concentrators and absorbers can be utilized and arranged in various ways to address a number of different sensor system design considerations including the sensitivity of the magnetic sensors, permeability tolerances, the strength and/or size of the magnetic source, the expected angle the magnetic source will come in proximity to the sensor system, the expected speed the magnetic source will come in proximity to the sensor system, the desired distance "r" required to trigger the sensor, distance between other concentrators/absorbers, and the packaging size of the sensor system.

Figure 6:
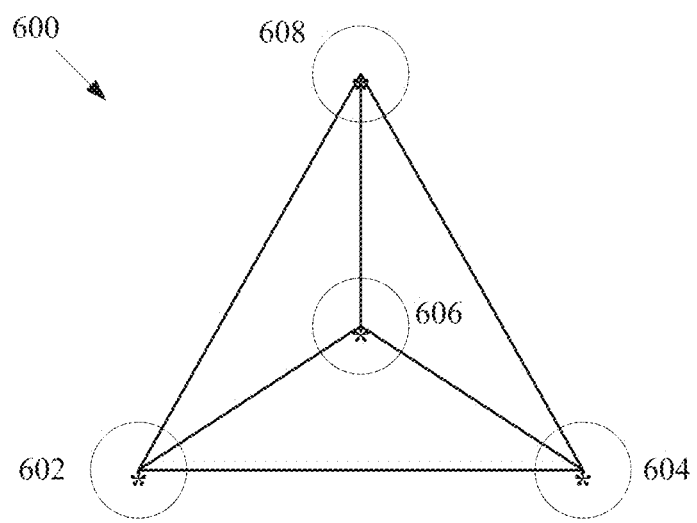
FIG. 6 shows a perspective view of a 3-D sensor system in accordance with an alternative embodiment.

FIG. 6 shows another embodiment in which sensor system 600 can detect the location of a magnetic source in three dimensions with respect to sensor system 600. Sensor system 600 includes a first magnetic sensor 602, a second magnetic sensor 604, a third magnetic sensor 606, and a fourth magnetic sensor 608 arranged in a three dimensional array such as a pyramid orientation. First magnetic sensor 602, second magnetic sensor 604 and third magnetic sensor 606 are co-planar while fourth magnetic sensor 608 is not co-planar with magnetic sensors 602, 604 and 606. For example, fourth magnetic sensor 608 can be disposed at either side of the plane formed by magnetic sensors 602, 604 and 606. In some embodiments, each magnetic sensor 602, 604, 606, 608 can be a triple axis sensor suitable for detecting a magnetic source in any direction. Generally, triple axis sensors are not sensitive to orientation or elevation relative to the magnetic source sensed.

Sensor system 600 can deduce the location of the magnetic source in three dimensions relative to sensor system 600 by comparing the output of each magnetic sensor 602, 604, 606, and 608. In addition, the distance between each magnetic sensor is known to assist in determining the location of the magnetic source. For example, a processor can perform a location-determining algorithm, such as triangulation or trilateration, using the outputs of each magnetic sensor and/or the distances between each magnetic sensor to determine a three dimensional location of the magnetic source in space at any given time given a sufficiently close proximity.

In one embodiment, a sensor system can use three magnetic sensors to detect a direction of a magnetic source. For example, two magnetic sensors can be disposed in a plane parallel to a top or bottom surface of an associated device while a third magnetic sensor can be disposed at either side of the plane. Like the dual magnetic sensors systems described above, using only three magnetic sensors can reduce components costs and packaging sizing when a lesser degree of location precision is sufficient. In another embodiment, a sensor system can use five magnetic sensors. For example, three magnetic sensors are disposed co-planar while a fourth sensor and fifth sensor are disposed on two opposing sides of the plane. Although a three dimensional fix can be determined by four magnetic sensors as described for sensor system 600, a fifth sensor can provide several advantages such as providing data for error checking, providing more data for faster location-determining calculation, and component redundancy in case of parts failure.

Figure 7:
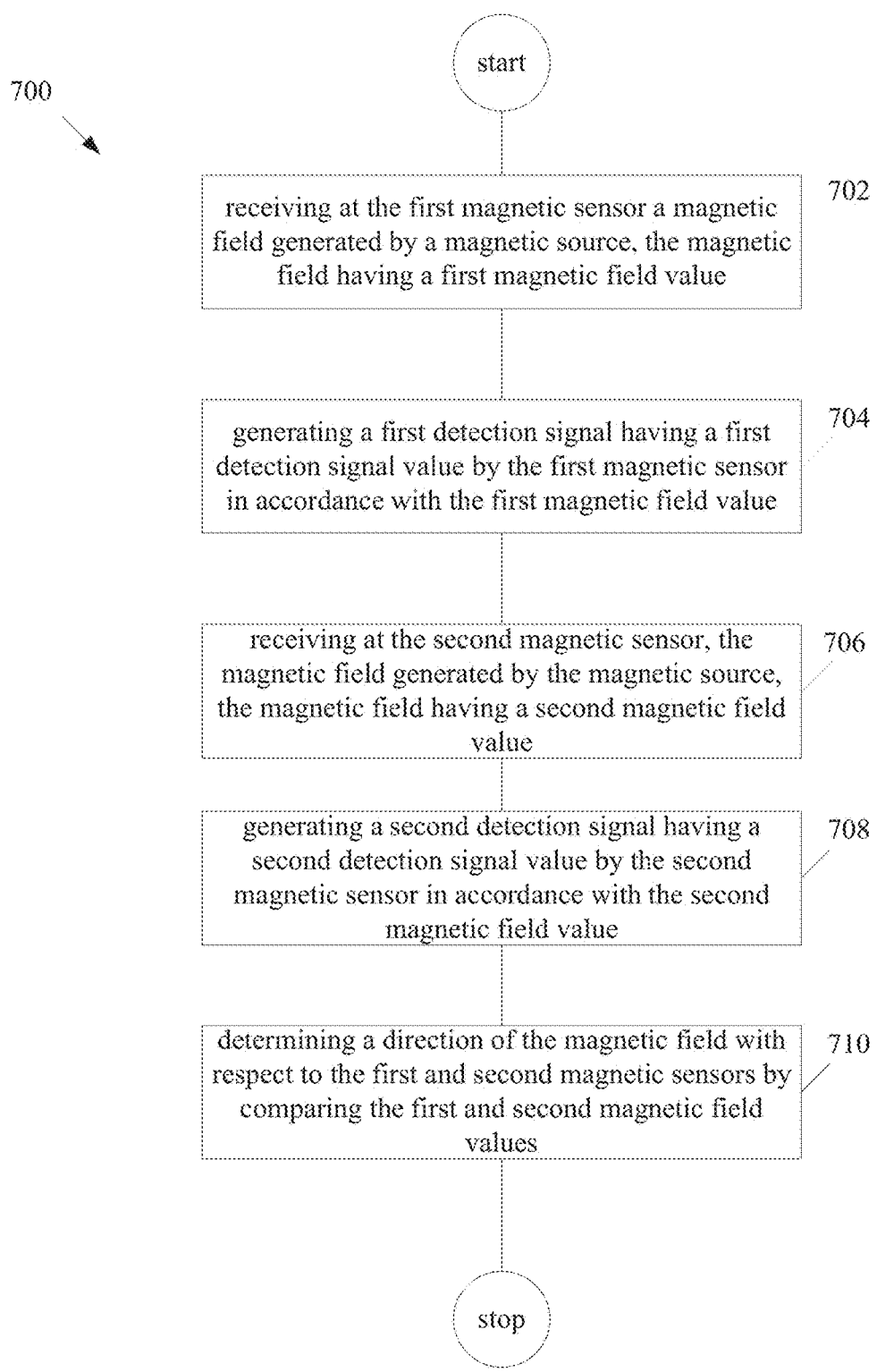
FIG. 7 shows a flowchart detailing a process in accordance with the described embodiments.

FIG. 7 shows a flowchart detailing a process in accordance with the described embodiments. Process 700 can be carried out at a sensor system comprising a first magnetic sensor and a second magnetic sensor, the second magnetic sensor being stacked atop the first magnetic sensor a distance d from the first magnetic sensor. Process 700 can begin at 702 receiving at the first magnetic sensor a magnetic field generated by a magnetic source, the magnetic field having a first magnetic field value. At 704, generating a first detection signal having a first detection signal value by the first magnetic sensor in accordance with the first magnetic field value, at 706 receiving at the second magnetic sensor, the magnetic field generated by the magnetic source, the magnetic field having a second magnetic field value, at 708 generating a second detection signal having a second detection signal value by the second magnetic sensor in accordance with the second magnetic field value, and 710, determining a direction of the magnetic field with respect to the first and second magnetic sensors by comparing the first and second magnetic field values.

Figure 8D:
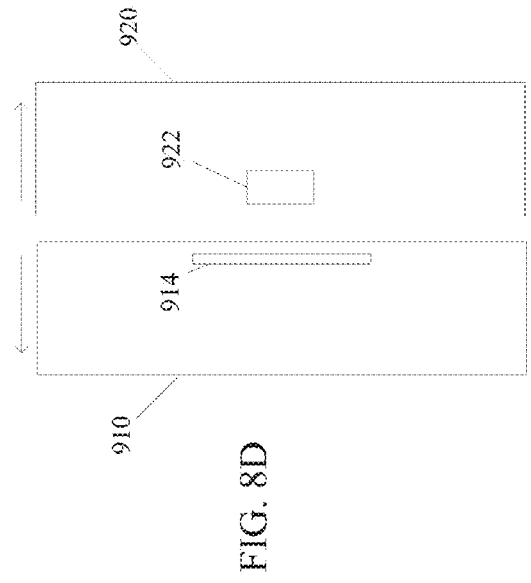
FIG. 8D shows a cross-sectional side view of the system of FIG. 8A when the first and second devices are back-to-back.
Figure 8C:
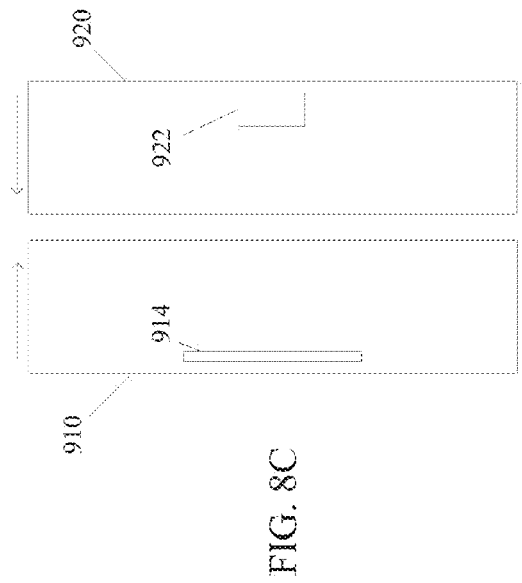
FIG. 8C shows a cross-sectional side view of the system of FIG. 8A when the first and second devices are facing each other.
Figure 8B:
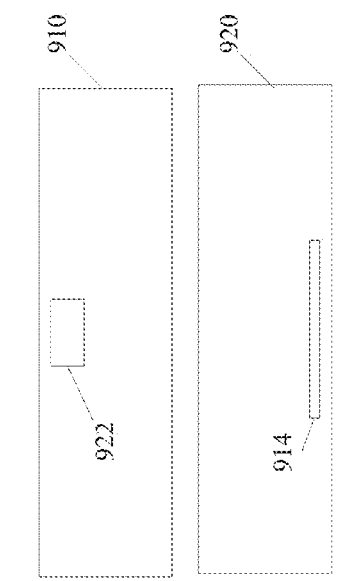
FIG. 8B shows a cross-sectional side view of the system of FIG. 8A when the second device is stacked atop the first device.
Figure 8A:
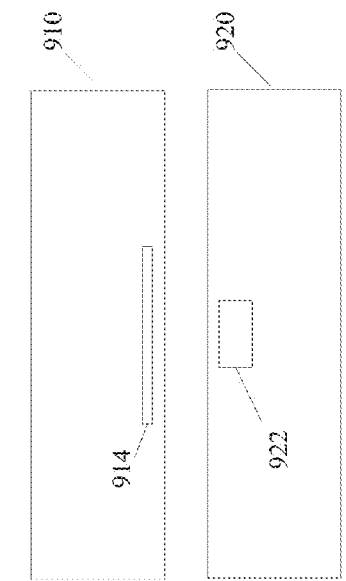
FIG. 8A shows a cross-sectional side view of a two device system when the first device is stacked atop the second device.

A sensor system can also be used to assist in determining the stacking order between at least two devices. FIG. 8A-8B shows a cross-sectional view of a first device 910 having a magnetic source 914 and a second device 920 having a sensor system 922. First device 910 is stacked on top of second device 920 in FIG. 8A and vice versa as shown in FIG. 8B. First device 910 and/or second device 920 can initiate an action (e.g. transmit data, initiate a protocol, sync settings, etc.) when the devices are stacked in a particular order. Furthermore, the stacking order can determine which device performs a particular action. For example, stacking smartphone A on top of smartphone B can indicate that smartphone A will receive data while smartphone B will send data. That is, an action can be unique to a particular stacking order.

A sensor system can also be used to assist in determining the orientation between at least two devices. FIGS. 8C-8D show the devices of FIG. 8A FIG. 8B. The arrows indicate the front of each device respectively such that the devices 910, 920 are facing each other in FIG. 8C and devices, are back-to-back in FIG. 8D. First device 910 and/or second device 820 can initiate an action (e.g. transmit data, initiate a protocol, etc.) when the devices are orientated in a particular order. The action can be unique to a particular orientation scheme. In some embodiments, for an action to be completed the magnetic fields can be shifted to accomplish various actions. For example, devices 910, 920 can be smart phones equipped with near field communication (NFC) technology that can physically "bump" together to transfer contact information, photos, and files. To ensure "bumping" occurs purposely, transferring only occurs when the devices 910, 920 are orientated back-to-back (FIG. 8D). When the devices 910, 920 are orientated face-to-face, no transferring of data can occur.

Although the foregoing disclosure has been described in detail by way of illustration and example for purposes of clarity and understanding, it will be recognized that the above described disclosure can be embodied in numerous other specific variations and embodiments without departing from the spirit or essential characteristics of the disclosure. Certain changes and modifications can be practiced, and it is understood that the disclosure is not to be limited by the foregoing details, but rather is to be defined by the scope of the appended claims.

What is claimed is:

1. A sensor system carried by an electronic device and configured to detect an external magnetic field emitted by a magnetic source embedded in a cover that is external to the electronic device, the electronic device having a top portion and a bottom portion opposite the top portion, the sensor system comprising:

a single substrate formed of non-magnetic material and having a first surface and a second surface and displaced from the first surface;

a first magnetic sensor at the first surface, the first magnetic sensor detecting the external magnetic field at the top portion;

a second magnetic sensor at the second surface, the second magnetic sensor detecting the external magnetic field at the bottom portion, wherein the first magnetic sensor and the second magnetic sensor concurrently (i) detect the external magnetic field and (ii) provide a first detection signal and a second detection signal, respectively, corresponding to a first magnetic field strength and a second detection signal corresponding to a second magnetic field strength, respectively; and a processing circuit coupled to the first magnetic sensor and the second magnetic sensor, the processing circuit using a difference between the first detection signal and the second detection signal to provide a direction of the external magnetic field and determine whether the cover is disposed on the top portion or the bottom portion, the processing circuit generating operation instructions that cause the electronic device to operate in accordance with a current position of the cover.

2. The sensor system as recited in claim 1, wherein the external magnetic field is a static magnetic field.

3. The sensor system as recited in claim 1, wherein the first magnetic sensor is offset on the first surface with respect to the second magnetic sensor on the second surface.

4. The sensor system as recited in claim 1, wherein the first and second magnetic sensors are each Hall Effect sensors, and wherein the first detection signal comprises a first output voltage and wherein the second detection signal comprises a second output voltage.

5. The sensor system as recited in claim 4, wherein the processing circuit comprises a comparator that compares the first output voltage and the second output voltage, wherein a first direction corresponds to the first output voltage being greater than the second output voltage and a second direction corresponds to the first output voltage being less than the second output voltage.

6. The sensor system as recited in claim 1, wherein the electronic device is operable in accordance with the direction of the external magnetic field.

7. The sensor system as recited in claim 1, wherein the electronic device operates in a first operating mode corresponding to a first direction of the external magnetic field and operates in a second operating mode corresponding to a second direction of the external magnetic field.

8. The sensor system as recited in claim 7, wherein the cover is pivotally attached to and movable with respect to the electronic device, thereby causing the magnetic source and the external magnetic field to move relative to the first magnetic sensor and the second magnetic sensor.

9. The sensor system as recited in claim 8, wherein the cover is arranged to move from a first position corresponding to the top portion to a second position corresponding to the top portion.

10. The sensor system as recited in claim 9, wherein the electronic device operates in the first operating mode corresponding to the first direction of the external magnetic field when the cover is at the first position, and operates in the second operating mode corresponding to the second direction of the external magnetic field when the cover is at the second position.

11. A method performed by a sensor system carried by an electronic device, the sensor system configured for detecting external an magnetic field emitted by a magnetic source embedded in a cover that is external to the electronic device, the electronic device having a top portion and a bottom portion opposite the top portion, the method comprising:

concurrently detecting the external magnetic field at the top portion by a first magnetic sensor and at the bottom portion by a second magnetic sensor;

generating a first detection signal by the first magnetic sensor and a second detection signal by the second magnetic sensor in accordance with the concurrent detecting of the external magnetic field; and processing the first detection signal and the second detection signal received from the first magnetic sensor and the second magnetic sensor, respectively, by a processing circuit using a difference between the first detection signal and the second detection signal to provide a direction of the external magnetic field and determine whether the cover is disposed on the top portion or the bottom portion, wherein at least one of the first detection signal and the second detection signal cause the processing circuit to generate operation instructions that cause the electronic device to operate in accordance with a current position of the cover.

12. The method as recited in claim 11, wherein the sensor system further comprises a single substrate formed of non-magnetic material and having a first surface and a second surface parallel to and displaced from the first surface.

13. The method as recited in claim 12, wherein the first magnetic sensor is at the first surface and the second magnetic sensor is at the second surface.

14. The method as recited in claim 11, wherein the first detection signal and the second detection signal comprise a first output voltage and a second output voltage.

15. The method as recited in claim 14, wherein the processing circuit compares the first output voltage and the second output voltage in accordance with a pre defined threshold voltage level.

16. The method as recited in claim 11, wherein the electronic device is operable in accordance with the direction of the external magnetic field.

17. A consumer product system, comprising:

an electronic device having a first portion and a second portion opposite the first portion, the electronic device comprising:

a sensor system configured to detect an external magnetic field generated by a magnetic source external to the electronic device and provide a first detection signal based on the external magnetic field detected at the first portion and at the second portion, a processing circuit in communication with the sensor system and arranged to (i) receive the first detection signal from the sensor system, (ii) use the first detection signal to determine a direction of the external magnetic field relative to the sensor system, and (iii) generate operation instructions for the electronic device in accordance with the direction of the external magnetic field; and a cover movably coupled to the electronic device and carrying the magnetic source such that the magnetic source moves in accordance with the cover, wherein when the cover changes position with respect to the sensor system, the sensor system detects a change in the direction of the external magnetic field and provides a second detection signal causing the processing circuit to generate operation instructions that cause the electronic device to operate in accordance with a current position of the cover.

18. The consumer product system as recited in claim 17, wherein the current position of the cover corresponds to the cover positioned at the first portion or at the second portion.

19. The consumer product system as recited in claim 17, wherein the sensor system comprises at least two in-line magnetically active regions spaced apart each of which is capable of concurrently (i) detecting the magnetic field and (ii) providing a signal used in providing at least one of the first detection signal and the second the detection signal.

20. The consumer product system as recited in claim 17, wherein:
- the sensor system comprises multiple magnetic sensors arranged in a pyramid orientation to detect the external magnetic field and provide detection signals to the processing circuit causing the processor circuit to determine a location of the magnetic source in three dimensions.

* * * * *